United States Patent
Higuchi et al.

(10) Patent No.: US 9,374,070 B2
(45) Date of Patent: Jun. 21, 2016

(54) RAMP GENERATOR CIRCUIT AND SOLID-STATE IMAGING DEVICE

(71) Applicant: PANASONIC INTELLECTUAL PROPERTY MANAGEMENT CO., LTD., Osaka (JP)

(72) Inventors: Masahiro Higuchi, Hyogo (JP); Hiroshi Fujinaka, Osaka (JP); Makoto Ikuma, Kyoto (JP)

(73) Assignee: PAANSONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 53 days.

(21) Appl. No.: 14/552,446

(22) Filed: Nov. 24, 2014

(65) Prior Publication Data

US 2015/0076325 A1    Mar. 19, 2015

Related U.S. Application Data

(63) Continuation of application No. PCT/JP2013/003279, filed on May 23, 2013.

(30) Foreign Application Priority Data

May 29, 2012   (JP) .................................. 2012-122479

(51) Int. Cl.
*H03K 4/90* (2006.01)
*H04N 5/357* (2011.01)
(Continued)

(52) U.S. Cl.
CPC ............ *H03K 4/90* (2013.01); *H01L 27/14645* (2013.01); *H03K 4/08* (2013.01); *H04N 5/357* (2013.01); *H04N 5/378* (2013.01)

(58) Field of Classification Search
CPC ........ H04N 5/378; H04N 5/357; H04N 5/374; H01L 27/146; H03M 1/56; H03K 4/90
See application file for complete search history.

(56) References Cited

U.S. PATENT DOCUMENTS 6,842,135 B2    1/2005  LaFlaquiere
6,956,413 B2    10/2005 Bailey
(Continued)

FOREIGN PATENT DOCUMENTS

JP    2007-059991 A    3/2007
JP    2009-033305 A    2/2009
(Continued)

OTHER PUBLICATIONS

International Search Report issued in International Application No. PCT/JP2013/003279 with Date of mailing Aug. 20, 2013, with English Translation.

*Primary Examiner* — Seung C Sohn
(74) *Attorney, Agent, or Firm* — McDermott Will & Emery LLP

(57) ABSTRACT

A ramp generator circuit includes: a reference signal generator circuit which generates a ramp waveform having a slope obtained by multiplication using a power of 2 according to a value of a higher order bit of a gain control signal; a clock control circuit which selectively outputs $2^m$ kinds of fractional-N clocks according to one of $2^m$ (natural number) areas obtained by dividing a code range represented by a lower order bit, when a negative gain is set; and a variable gain circuit which sets a ramp waveform according to the value of the gain control signal, and sets a ramp signal amplitude in each area so that a period ratio between ramp driving clocks for adjacent areas and a ratio between an amplitude of a ramp signal when the standard gain is set and a largest amplitude of a ramp signal are equal.

5 Claims, 16 Drawing Sheets

(51) Int. Cl.
*H04N 5/378* (2011.01)
*H03K 4/08* (2006.01)
*H01L 27/146* (2006.01)

(56) References Cited

U.S. PATENT DOCUMENTS

| | | | |
|---|---|---|---|
| 7,423,570 | B2 | 9/2008 | Asayama et al. |
| 7,948,415 | B2 | 5/2011 | Asayama et al. |
| 7,973,695 | B2 | 7/2011 | Kudo |
| 8,093,543 | B2 | 1/2012 | Yamaoka et al. |
| 8,674,865 | B2 | 3/2014 | Asayama et al. |
| 8,969,770 | B2* | 3/2015 | Kim .................... G01J 1/44 250/208.1 |
| 2002/0158787 | A1* | 10/2002 | Suzuki ................ H03M 1/765 341/154 |
| 2007/0194962 | A1* | 8/2007 | Asayama ............ H03M 1/1014 341/144 |
| 2008/0296473 | A1* | 12/2008 | Yamaoka ............. H03K 4/023 250/205 |
| 2009/0009641 | A1 | 1/2009 | Asayama et al. |
| 2010/0253560 | A1 | 10/2010 | Kudo |
| 2011/0114827 | A1 | 5/2011 | Yamaoka et al. |
| 2011/0169990 | A1 | 7/2011 | Higuchi et al. |
| 2011/0221619 | A1 | 9/2011 | Asayama et al. |

FOREIGN PATENT DOCUMENTS

| | | |
|---|---|---|
| JP | 2009-077172 A | 4/2009 |
| JP | 2010-259051 A | 11/2010 |
| JP | 2011-041205 A | 2/2011 |
| JP | 4682750 B2 | 5/2011 |
| WO | 2010/035402 A1 | 4/2010 |

\* cited by examiner

RAMP GENERATOR CIRCUIT AND SOLID-STATE IMAGING DEVICE

CROSS REFERENCE TO RELATED APPLICATIONS

This is a continuation application of PCT International Application No. PCT/JP2013/003279 filed on May 23, 2013, designating the United States of America, which is based on and claims priority of Japanese Patent Application No. 2012-122479 filed on May 29, 2012. The entire disclosures of the above-identified applications, including the specifications, drawings and claims are incorporated herein by reference in their entirety.

FIELD

The present disclosure relates to an analog-to-digital converter circuit (hereinafter denoted as ADC) applicable to a solid-state imaging element represented by a CMOS image sensor, and particularly to a solid-state imaging device equipped with a single-slope type (or integration or counter-type) ADC.

BACKGROUND

In recent years, high-speed continuous shooting or movie shooting functions are mounted and become popular as standard functions in digital cameras ranging from compact cameras to single-lens reflex cameras.

As a method for quickly reading out image data of an imaging element having a large number of pixels, column-parallel AD conversion method is generally used. The column-parallel AD conversion method is intended to incorporate an ADC for each of columns of a pixel array, and perform AD conversion at one time on the signals output from pixels in the column of the pixel array in a horizontal scanning period. As an ADC circuitry in this case, a single-slope type ADC (hereinafter denoted as an SS-ADC) is generally used. The SS-ADC is a small-scale circuit that can be housed in an area having a width corresponding to a column width that is determined by a pixel pitch. The SS-ADC is intended to input, as a reference signal, a ramp signal having a correlation with a count value of a counter to a comparator, and output, as a result of analog-to-digital (AD) conversion, a count value at the time when a match between an analog signal and a reference ramp signal is detected by the comparator.

With the increase in the resolutions of solid-state imaging elements, noise reduction is desired. In general, noise that occurs from a solid-state imaging device can be roughly divided into fixed pattern noise (FPN) and random noise. As for FPN, a column in which noise occurs is fixed on a per device basis. Thus, noise is optimized on a per device basis according to a correction technique by digital signal processing performed at a subsequent stage of the solid-state imaging device, and a large part of the noise can be removed. As for random noise, it is difficult to perform such a correction process. However, the random noise appears at random on the entire image generally according to a normal distribution, and thus it is difficult to visually recognize the noise. However, random noise components that are generated mainly from noise superimposed on a reference ramp signal of the SS-ADC appear in irregular rows and levels. Accordingly, random noise components have features that they appear in a vertical direction of the image without according to a normal distribution, and are noticeable as random horizontal noise.

As a configuration of a ramp generator circuit, a ladder resistor type voltage DAC, a current-steering type DAC or the like is used (see Patent Literature 1 and Patent Literature 2).

In addition, as a method for increasing the slope of a ramp signal voltage that is a time variation rate of the ramp signal voltage, the slope can be increased by increasing the difference between a start voltage and an end voltage of a ramp signal, or alternatively by increasing a driving frequency of the ramp signal (see Patent Literature 2).

CITATION LIST

Patent Literature

[PTL 1]
U.S. Pat. No. 6,956,413, Specification
[PTL 2]
Japanese Patent Publication No. 4682750

SUMMARY

Technical Problem

The analog variable gain control that controls the slope of the ramp signal requires a finer gain adjustment accuracy for an ADC having a higher resolution. In addition, there is a need to secure a wide variable range at the negative gain side according to the number of mixed pixels in a pixel signal.

However, in the ramp generator circuit having the ladder resistor type voltage DAC disclosed in Patent Literature 1, the slope of a ramp is controlled by adjusting a full-scale current, which determines a voltage at an end point of a ladder resistor. In this way, a maximum range for a difference between a start voltage and an end voltage of a ramp signal is restricted to a voltage range of a power supply. In other words, it is impossible to control a voltage difference range corresponding to or exceeding the slope of a certain level or a higher level by performing only the method for increasing the difference between the start voltage and the end voltage of the ramp signal.

Such a restriction is prevented using a method for steepening the slope of the ramp signal and also using a means for increasing a driving frequency of the ramp signal. More specifically, it is possible to increase the slope m times by increasing, m times, a clock frequency of a shift register that performs control for continuously switching switches for selecting voltage distribution points in the ladder resistor starting at the start voltage side and ending at the end voltage side. In this way, for example, when m=2 is satisfied, and when the slope of the ramp signal is increased from single to double in the negative gain direction, the slope is steepened by increasing the full-scale current one step before the time when the slope is doubled. When the double slope is set, a clock of the shift register is switched to double so that the full-scale current is returned to a current at the time of the single slope. In this way, it is possible to generate a ramp signal having a double slope with the same full-scale current that is set in the case of the single slope while continuously controlling the slope of the ramp signal. Next, as for the range from double to quadruple slopes, each slope is steepened by increasing the full-scale current one step before the time when the slope is quadrupled in the same manner as the countermeasure described above. When the quadruple slope is set, it is possible to generate a ramp signal having a quadruple slope with the same full-scale current as in the case of the single slope by further doubling the clock frequency while continuously controlling the slope of the ramp signal. By repeating this in the same manner, it is possible to control continuously the slope of the ramp signal at the negative gain side.

However, these countermeasures are not effective enough to secure a voltage range of an input signal of the SS-ADC and to prevent electric power consumption from being increased due to the full-scale current. When the gain at the time of the slope (that is single) of the ramp signal adjusted to a standard amplitude of a pixel signal is assumed to be 0 dB, the amplitude of the ramp signal at the time of the gain one step before the time of −6 dB (a double slope) is approximately doubled with respect to the amplitude at the time of 0 dB. In other words, in the ladder resistor type voltage DAC, the amplitude of the ramp signal adjusted to the standard amplitude of the pixel signal needs to be used within a range restricted to ½ or below of the maximum amplitude of the ramp signal. This causes reduction in power supply voltage, and also causes, reduction in voltage range when an image sensor having a high pixel saturation level is used, disabling to secure a necessary amplitude of a ramp signal.

In addition, the full-scale current differs by approximately 2 times at most between 0 dB to −6 dB, and electric power consumption changes significantly depending on a set gain. In this case, a drop caused by a parasitic resistance caused by wiring is a factor of variation in a GND potential in a circuit, raising a concern about influence onto characteristics of peripheral circuits that share the GND.

On the other hand, it is possible to eliminate the need to control a full-scale current by multiplying the frequency of a shift register clock at an arbitrary magnification. However, such multiplication is not practical because of the requirement that a Phase Lock Loop (PLL) and a Voltage Control Oscillator (VCO) exclusive therefor need to be mounted, resulting in size increase that is a significant disadvantage.

In view of this, the ramp generator circuit and the solid-state imaging device in the present disclosure secure, to the maximum, a ramp signal amplitude corresponding to a standard amplitude of a pixel signal within a limited power supply voltage range and reduces increase in power consumption, and furthermore reduces random horizontal noise.

Solution to Problem

A ramp generator circuit according to an aspect of the present disclosure includes: a reference signal generator circuit which includes a function for generating a ramp driving clock by multiplying an input clock frequency by a predetermined power of 2 according to a value of a higher order bit of a gain control signal, and generates a ramp waveform by outputting a step voltage signal in synchronization with the ramp driving clock, the step voltage signal having a voltage variable by a fixed amount per unit time ranging from a predetermined start voltage to a predetermined end voltage; a clock control circuit which: (i) when a value of a gain control signal indicates a negative gain smaller than a standard gain, associates, one to one, fractional-N clocks as input clocks of the reference signal generator circuit with areas, and selectively outputs, as one of the input clocks of the reference signal generator circuit, one of the fractional-N clocks which is used in an associated one of the areas to which the gain control signal belongs, the fractional-N clocks including $2^m$ kinds of fractional-N clocks obtained by performing fractional-N frequency division on a frequency of a base clock according to $1/\{2^{(m+1)}-n\}$ (an integer satisfying $0 \leq n < 2^m$) and being associated with the areas in an ascending order of frequencies, the areas being obtained by dividing a code range of $2^m$ (an integer satisfying $m>0$) represented by a lower order bit of the gain control signal and being associated with the input clocks in an ascending order of differences from a value of a gain control signal at a time when the standard gain is set; and (ii) when the value of the gain control signal indicates a positive gain larger than or equal to the standard gain, selectively outputs, as one of the input clocks of the reference signal generator circuit, a lowest-frequency fractional-N clock among the $2^m$ kinds of fractional-N clocks; a standard voltage control circuit which outputs a standard voltage controlled to have a magnification equal to a period ratio between the one of the input clocks selectively output from the clock control circuit and an input clock of the reference signal generator circuit at the time when the standard gain is set; a variable gain circuit which: (i) sets the start voltage and the end voltage to be supplied to the reference signal generator circuit according to the value of the gain control signal, (ii) controls amplitudes of ramp signals exponentially so that amplitude rates each defined by a ratio between a slope of a ramp signal in a case where the value of the gain control signal is a preset value of the standard gain and a slope of a ramp signal in a case where the value of the gain control signal is an arbitrarily set value of a gain become linear with respect to the value of the gain control signal; and (iii) sets the predetermined start voltage and the predetermined end voltage which define the ramp waveform which is of each of the areas so that (a) a period ratio between ramp driving clocks for adjacent ones of the areas and (b) a ratio between an amplitude of a ramp signal at the time when the standard gain is set and a largest amplitude of a ramp signal in each of the areas are equal to each other, when the value of the gain control signal indicates the negative gain after receiving the standard voltage output from the standard voltage control circuit; and an attenuator which is connected to a subsequent stage of the reference signal generator circuit, and outputs a ramp signal by attenuating the ramp waveform generated by the reference signal generator circuit. The attenuator (i) may be connected to a subsequent stage of the reference signal generator circuit, (ii) may fixedly set an attenuation ratio to a predetermined value when the value of the gain control signal indicates the negative gain, (iii) may set the attenuation ratio so that an amplification rate of an entire system including the amplification rates becomes linear with respect to the value of the gain control signal by performing variable control on the attenuation ratio when the value of the gain control signal indicates a positive gain larger than or equal to the standard gain, and (iv) may output the ramp signal by attenuating the ramp waveform generated by the reference signal generator circuit according to the attenuation ratio.

In the above configuration, the multiplication at the higher order bit of the gain control signal and the frequency division switching of the base clock of the lower order bit are combined.

The reference signal generator circuit has the clock multiplication function for multiplying the frequency of the input clock by the power of 2 according to the higher order bit of the gain control signal, and thereby changing the time axis of the ramp signal on a per 2 times basis by controlling the least significant bit (LSB) of the gain control signal. In this way, a rough-adjustment variable gain function on a per 6 dB basis in the higher order bit control is realized.

In addition, it is assumed that the clock control circuit generates a plurality of frequency clocks each of which is a fractional-N clock obtained by dividing the frequency of a harmonic base clock under frequency division ratio control (for making the period of an input clock to be an integer-multiple of the period of the base clock) performed on a per base clock period basis. In this way, the reference clock can be multiplied using a simple circuit configuration for masking a base clock pulse.

In this way, the switch on a per doubled frequency basis by the higher order bit of the gain control signal and the switch in the range up to the doubled frequency by the lower order bit are combined, so that switches can be made in the entire frequency range without increasing the number of kinds of frequencies to be generated by dividing the frequency range.

In addition, since the higher order bit of the gain control signal is used to perform the variable gain function for rough adjustment on a per 6 dB basis, the lower order bit is necessarily used to perform the variable gain function for fine adjustment in the range from 0 dB to 6 dB so as to perform the variable gain control continuously. In the range between 0 dB and 6 dB, both of the clock control circuit and the variable gain circuit that controls the difference voltage between the start voltage and the end voltage of the ramp signal are used. In this way, it is possible to provide an advantageous effect of saving the voltage range used only to control the slop of the ramp signal without being used as a voltage range necessary for AD conversion.

The clock control circuit generates several kinds of fractional-N clocks obtained through frequency division equal in number to the areas in the code range for the lower order bit of the gain control signal. For this purpose, a switch between input clock frequencies is made together with ramp signal amplitude control by the variable gain circuit so that the slopes of the adjacent areas of the ramp signal match each other at the boundary points in order to control the slope of the ramp signal to be continuous between the adjacent areas.

In other words, the variable gain circuit includes a function for switching the amplitudes of the ramp signal at a ratio equal to the period ratio between two kinds of input clocks of adjacent ones of the areas at the same time when the input clock frequencies are switched before or after a lower order bit code at a boundary point.

In addition, the attenuator reduces the amplitude of the ramp signal maximized within the power supply voltage range to the amplitude necessary for the AD conversion, and also exerts the function for reducing noise. Particularly in order to reduce noticeable noise that occurs at the time of imaging, a fixed attenuation ratio is set in a range from or below a certain gain including the negative gain, and the attenuation ratio is reduced under variable control at the higher gain side (that is, the area in which the value of a gain control signal is larger than a predetermined value) higher than the certain gain. The attenuation ratio control is a function for changing a scaling down ratio of the ramp signal amplitude, and is substantially equivalent to amplification rate control for a variable gain circuit. For this reason, the attenuation ratio and the amplification rate of the variable gain circuit are controlled so that a total amplification rate obtained by multiplying the amplification rate and the attenuation ratio of the variable gain circuit becomes linear with respect to the value of the gain control signal.

In this way, it is possible to secure a wide ramp signal amplitude to the power supply voltage range without increasing the chip size. Thus, it is possible to secure a wide ramp signal amplitude even when applying the present disclosure to reduction in voltages of the power supply and to a solid-state imaging element having a high pixel saturation level. This makes it possible to reduce power consumption, and reduce random noise that occurs in the ramp signal. In addition, the difference voltage between the start voltage and the end voltage of the ramp signal is small in the negative gain range. This reduces variation in the power supply current due to a set gain, and provides an advantageous effect of being able to reduce influence to peripheral circuits made by voltage variation through shared impedances of a power supply and grounds.

In addition, the reference signal generator circuit may include: a ladder resistor string in which a plurality of unit resistors are connected in series; switches each of which selects one of voltage division points which are connection points in the ladder resistor string; and a shift register which causes the switches to switch between open and closed states, and the shift register: (i) may sequentially cause, starting with one of the switches which is closest to one of both ends of the ladder resistor string, the switches to switch between open and closed states in synchronization with the ramp driving clock, so that voltages generated sequentially at the voltage division points selected by the switches form a ramp waveform; (ii) may include a plurality of flip-flops and a plurality of selectors arranged alternately in a column, and controls the selectors according to a value of a higher order bit of the gain control signal so that each of the voltage division points which are for a power-of-2 number of flip-flops positioned serially on a per power-of-2 basis among the plurality of flip-flops is switched in synchronization with the ramp driving clock; and (iii) may change the slope of the ramp waveform on a per power-of-2 basis according to the value of the higher order bit of the gain control signal, by voltages generated by the shift register at the voltage division points for the power-of-2 number of flip-flops.

In addition, the attenuation ratio may be variably controlled by a power-of-2 ratio according to a value of a higher order bit of the gain control signal, when the value of the gain control signal indicates the positive gain.

In addition, the present disclosure can be realized not only as the ramp generator circuit having the above-described features, but also as a solid-state imaging device that includes the ramp generator circuit and thereby provides the same or similar advantageous effect.

Advantageous Effects

The ramp generator circuit and the solid-state imaging device according to the present disclosure make it possible to secure a wide ramp signal amplitude to the power supply voltage range without increasing the chip size. Thus, even when the present disclosure is applied to reduction in voltages of the power supply and to the solid-state imaging element having a high pixel saturation level, it is possible to secure a sufficiently wide ramp signal amplitude, and provide an advantageous effect of being able to obtain an image in which random horizontal noise is reduced and thus that has an excellent quality.

BRIEF DESCRIPTION OF DRAWINGS

These and other objects, advantages and features disclosed herein will become apparent from the following description thereof taken in conjunction with the accompanying drawings that illustrate a specific embodiment of the present disclosure.

DESCRIPTION OF EMBODIMENTS

Hereinafter, ramp generator circuits and a solid-state imaging device according to exemplary embodiments will be described in detail with reference to the Drawings.

Embodiment 1

1. Structure of Solid-state Imaging Device

Figure 1:
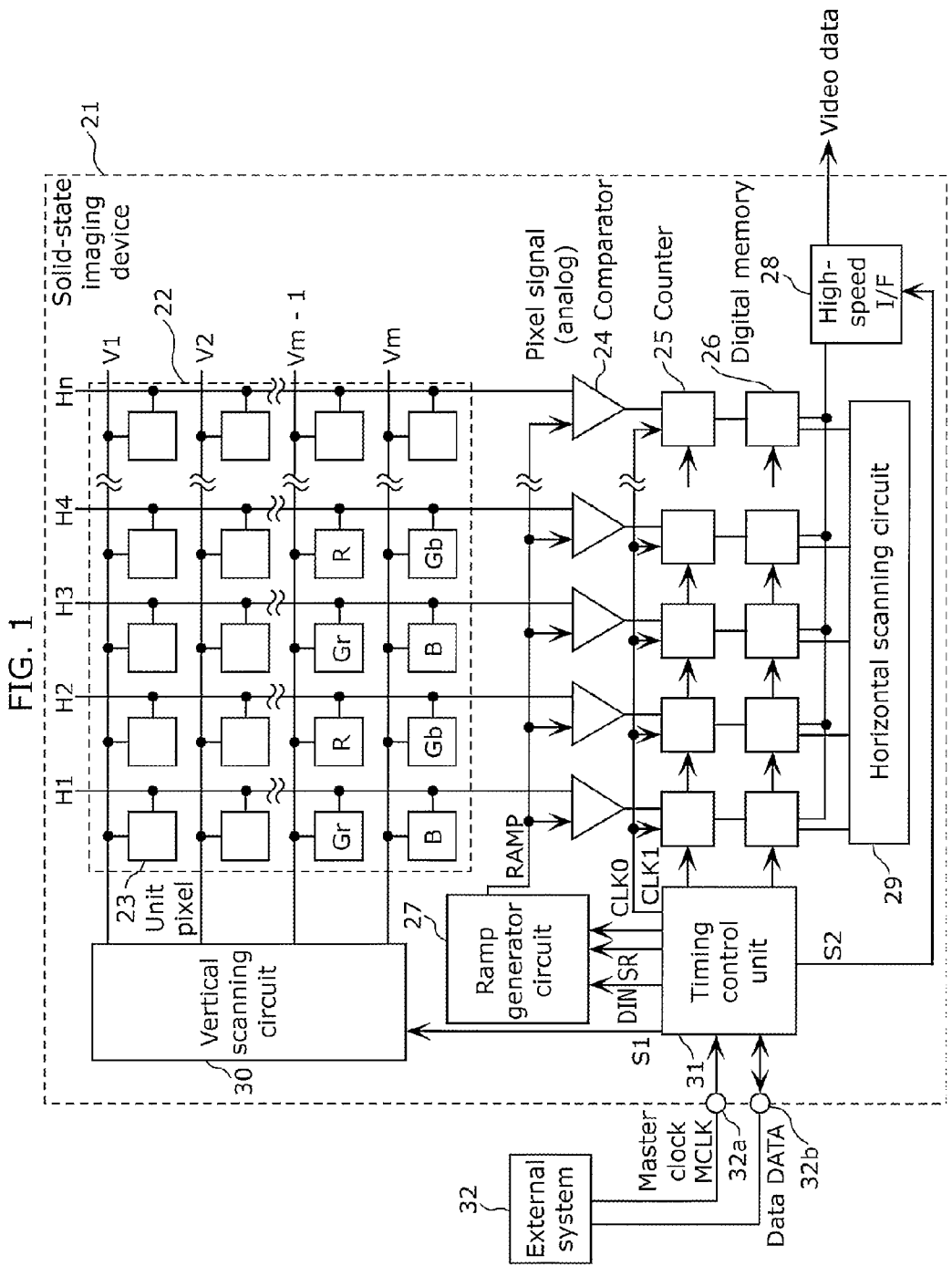
FIG. 1 is a plan view of a configuration of a solid-state imaging device including an SS-ADC according to the present disclosure.

FIG. 1 is a plan view of a configuration of a solid-state imaging device 21 including an SS-ADC according to the present disclosure. In the diagram, the solid-state imaging device 21 includes: a pixel array 22 in which a plurality of unit pixels 23 are arranged in rows and columns; and includes, outside the pixel array 22, the following: comparators 24, counters 25, and digital memories 26 all provided on a per column basis; a ramp generator circuit 27 which supplies a reference voltage RAMP for AD conversion to each comparator 24; and a high-speed interface (high-speed I/F) 28. FIG. 1 illustrates a case of a Bayer array in which a set of 4 pixels appears iteratively as a color filter array in the pixel array 22.

Sets of a comparator 24, a counter 25, and a digital memory 26 composes the SS-ADC (single slope type ADC). The SS-ADC included in the solid-state imaging device 21 inputs, as a reference signal, a ramp signal having a correlation with a count value of the counter 25 to the comparator 24. Next, a count value at the time when the comparator 24 detects a match between an analog signal and a reference ramp signal is output as a result of the AD conversion. The sequential operations of reading the pixel data on a per row basis of the pixel array, parallel AD conversion by a column ADC embedded on a per row basis, and output of digital image data on a per row basis obtainable as a result of the AD conversion are repeated. With the sequential operations, video signals of the two-dimensional pixel array are output as time-series data.

In the pixel signal processing steps performed by the solid-state imaging device 21, in order to utilize performances of the ADC to the maximum, and to reduce deterioration in a signal to noise ratio (S/N) due to quantization noise, each of analog outputs of pixel signals needs to be subjected to a variable gain process for amplifying the output to have an amplitude optimum for an input dynamic range of the ADC. In the SS-ADC, the analog variable gain function is realized by control of the slope of a reference ramp signal. More specifically, a difference between a start voltage and an end voltage of the reference ramp signal is varied according to a digital gain control signal to be input to the ramp generator circuit 27 from outside. In this way, the slope of the ramp signal is controlled. The variable gain process is realized by changing a voltage accuracy per resolution of the ADC.

In addition, there is a case where the solid-state imaging device 21 having a large number of pixels performs mixing or thinning signals of read-out same-color pixels adjacent vertically or horizontally while shooting a video, so as to reduce the amount of data per frame and thereby achieve high-speed video shooting. In particular, when mixing pixels, a process of applying a negative gain is performed to compress a bit length for each pixel signal. In other words, the slope of the reference ramp signal is steepened to increase a voltage per resolution and complete comparison by the comparator 24 in short time. In this way, AD conversion time is shortened, which makes it possible to increase the frame rate.

In addition, the solid-state imaging device 21 includes: a horizontal scanning circuit 29 (also referred to as a column scanning circuit) for controlling column addresses and column scanning; a vertical scanning circuit 30 corresponding to a row scanning unit for controlling row addresses and column scanning, and a timing control unit 31. The timing control unit 31 receives a master clock MCLK through a terminal 32a, and receives timing setting data and information (data DATA) of various kinds of control signals from an external system 32 through the terminal 32b. The timing control unit 31 generates various kinds of internal clocks and control signals, and controls the horizontal scanning circuit 29, the vertical scanning circuit 30, and the ramp generator circuit 27.

In addition, each unit pixel 23 is connected to one of horizontal signal lines (also referred to as row control lines) V1 to Vm which are controlled by the vertical scanning circuit 30 and one of vertical signal lines (also referred to as column control lines) H1 to Hn which transfer pixel signals to the comparator 24. The pixel signals from the respective unit pixels 23 are input to the comparators 24 via vertical signal lines (H0, H1, . . . , Hn) for the respective horizontal signal lines (v1, v2, . . . , Vm). The comparator 24 compares each of the analog pixel signals with a reference voltage RAMP generated by the ramp generator circuit 27. The counter 25 counts time until comparison processes by the comparator 24 are completed. The digital memory 26 holds counted time information. The sequence of operations realizes an AD conversion function.

In addition, a reference voltage RAMP is input in common to a first input terminal of each comparator 24 and first input terminals of the comparators 24. The reference voltage RAMP is generated to have a stair shape by the ramp generator circuit 27 (the shape may actually be transformed into a slope shape due to wiring load etc.). In addition, second input terminals thereof are respectively connected to corresponding vertical signal lines (H1, H2, . . . , Hn), and pixel signal voltages are separately input from the pixel array 22 to the second terminals. The output signals of the comparators 24 are supplied to the counters 25.

Each counter 25 starts counting using a clock signal at the same time when the slope of a reference voltage RAMP to be input to the comparator 24 starts. Through comparison and matching between each of the analog pixel signals input through a corresponding one of the vertical signal lines (H1, H2, ... Hn) and the reference voltage RAMP, AD conversion is performed by keeping counting until a pulse signal is obtained from the comparator 24.

In addition, at the same time when the AD conversion is performed, a process for obtaining a difference between a reset component Vrst (including noise) immediately after a pixel reset and a data component (a reset component Vrst+ a signal component Vsig) including a true signal component (according to the amount of received light) is performed on each of the pixel signals of analog voltages input through the vertical signal lines (H1, H2, ... Hn). In other words, the AD conversion process of the reset signal and the AD conversion process of the signal according to the amount of received light are separately performed. Next, a process of obtaining the difference between the results of the both AD conversion processes, it is possible to remove variation in clock skew, counter delay, etc. of columns, which may cause an error between the columns in the AD conversion processes, and to extract only the true signal level Vsig. In other words, a digital Correlated Double Sampling (CDS) becomes possible.

For example, FIG. 1 illustrates a configuration for extracting only true signal components Vsig by counting down the number of reset components Vrst (including noise) and counting up the number of data components (reset components Vrst+ signal components Vsig). The pixel data digitalized by the AD conversion processes and represented by horizontal selection signals are sequentially transferred from the horizontal scanning circuit 29, and are output via the high-speed I/F 28.

The timing control unit 31 receives a master clock MCLK and gain control information (dataDATA) from the external system 32.

In this way, the timing control unit 31 generates a base clock CLK0 for driving the ramp generator circuit 27 and a reset signal SR, and transmits them to the ramp generator circuit 27. In addition, the timing control unit 31 transmits the gain control information to the ramp generator circuit 27 via a digital control signal DIN.

The ramp generator circuit 27 internally generates a gain setting code GC, a gain area identification signal GAS, and a ramp generating clock, based on the base clock CLK0, the reset signal SR, and the digital control signal DIN which have been input. Through these operations and operations to be described in Embodiments 1 and 2, a ramp signal RAMP is generated and output to the comparator 24.

[1. 1 Structure of Ramp Generator Circuit]

Figure 2:
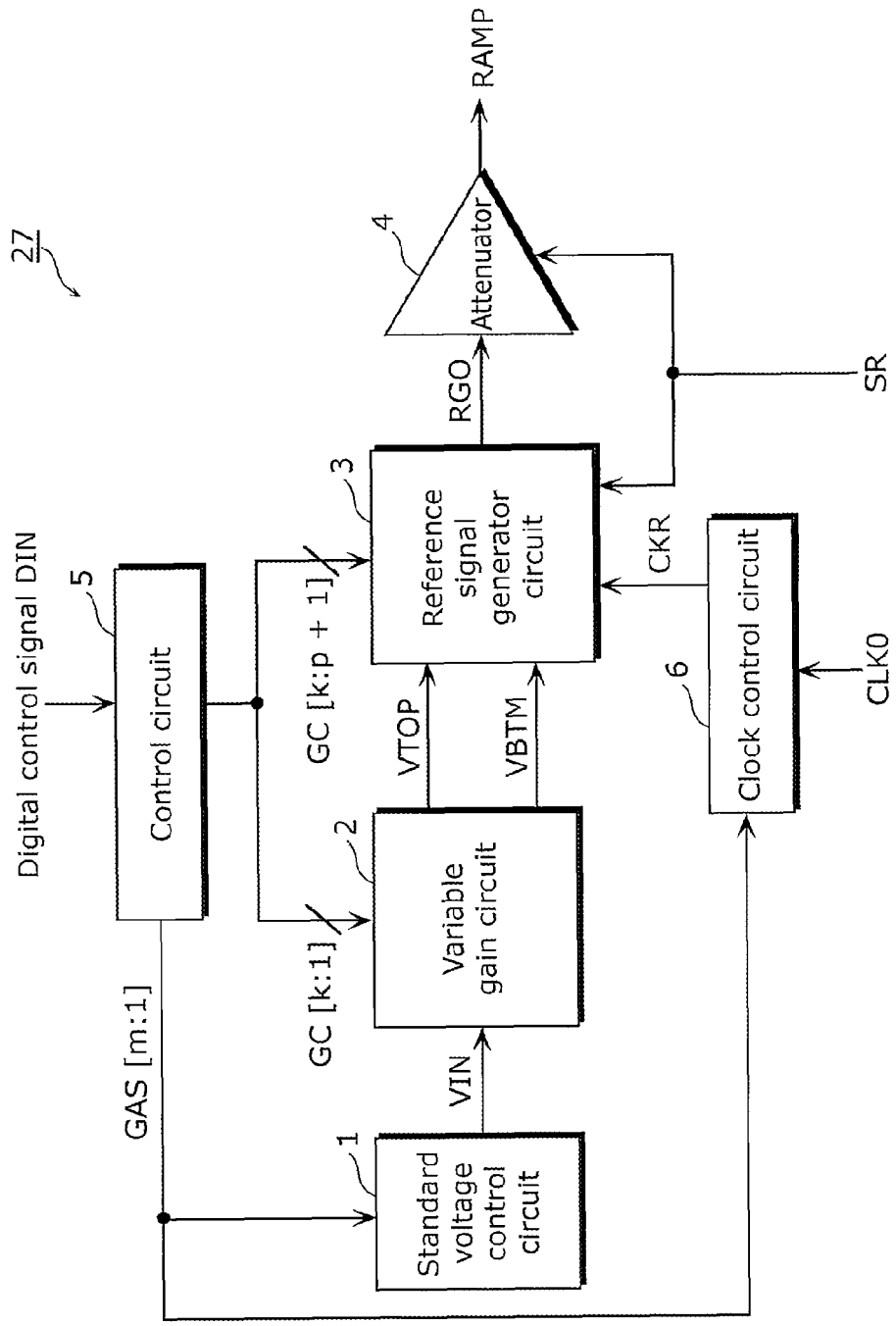
FIG. 2 is a diagram of an exemplary configuration of a ramp generator circuit according to Embodiment 1.

FIG. 2 is an exemplary diagram of a configuration of the ramp generator circuit 27 according to Embodiment 1. The ramp generator circuit 27 illustrated in the diagram includes: a standard voltage control circuit 1 which generates a standard voltage VIN; a variable gain circuit 2 which performs variable control on a start voltage VTOP and an end voltage VBTM of a ramp signal; a reference signal generator circuit 3 which generates the ramp signal; an attenuator 4 which adjusts the amplitude of the ramp signal to an amplitude necessary for AD conversion; a control circuit 5 which generates a control signal for each of blocks constituting the ramp generator circuit 27 in response to a digital control signal DIN; and a clock control circuit 6 which generates a ramp generating clock CKR, based on an external clock CLK0.

The control circuit 5 receives an input of the digital control signal DIN, and outputs a gain area identification signal [m:1] and a gain setting code GC [k:1] of a k bit, based on a gain control signal value transferred in the form of the digital control signal DIN.

The gain area identification signal GAS [m:1] is used to divide a code range represented by a lowest bit of the gain setting code GC [k:1] into areas according to 2 m {an integer satisfying m>1} in a negative gain range in which the value of a gain control signal indicates a gain lower than a standard gain which has been set. The gain area identification signal GAS [m:1] is an m-bit signal indicating area information of an area to which the gain setting code GC [k:1] belongs, and is input to the standard voltage control circuit 1 and the clock control circuit 6.

The gain setting code GC [k:1] controls a variable gain circuit 2, and a signal gain setting code GC [k:p+1] of one or more higher order bits (k−p) thereof is input to the reference signal generator circuit 3.

In addition, the attenuation ratio of the attenuator 4 is set to a predetermined fixed value.

Operations by the ramp generator circuit 27 configured as described above are described below. To simplify the description, the description is given of a case in which the gain setting code is 10 bits (k=10, p=6), that is, the higher order bits are 4 bits, and the lower order bits are 6 bits.

In FIG. 2, the digital control signal DIN is used to input the value of a gain control signal and area information of an area having a variable gain lower than or equal to 6 dB to the control circuit 5.

The control circuit 5 controls a control signal for each of blocks constituting the ramp generator circuit 27, based on information included in the input digital control signal DIN. Here, the gain setting code GC [10:1] is assigned so that gain control is performed on a per 6 dB basis for the higher 4 bits and in a range from 0 to 6 dB for the lower 6 bits.

As for the assignment for the gain control on the higher order bits and the lower order bits, a clock multiplier circuit included in the reference signal generator circuit 3 can also determine such an assignment.

[1. 1. 1 Structure of Reference Signal Generator Circuit]

Figure 3A:
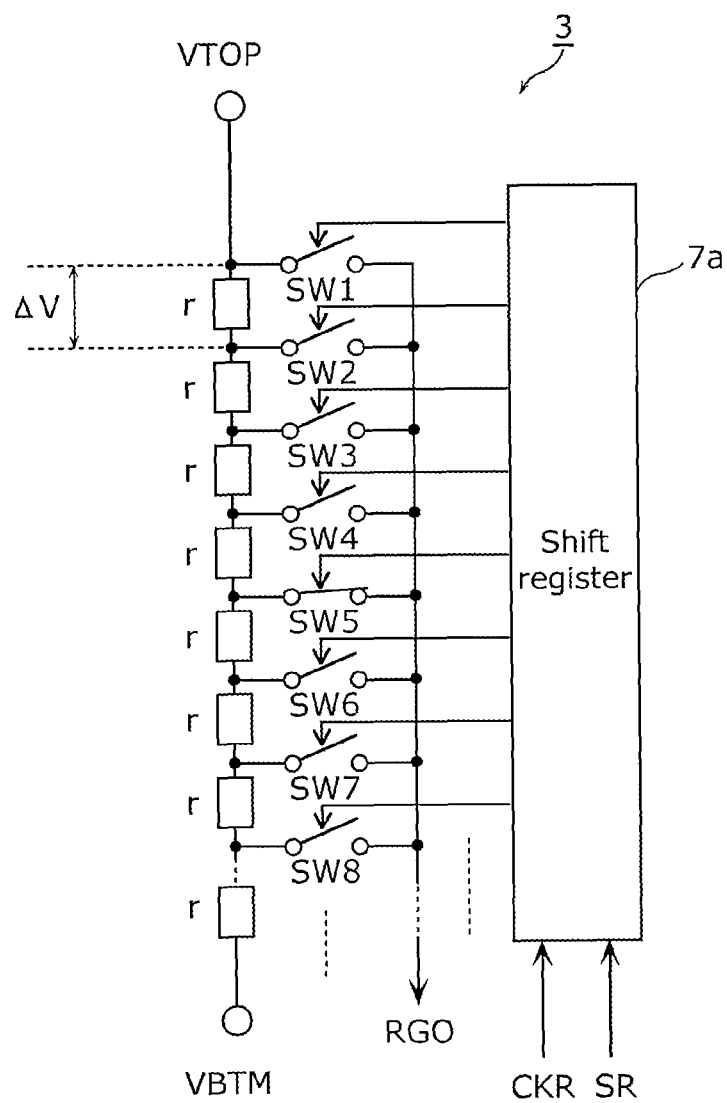
FIG. 3A is a diagram of an exemplary configuration of a conventional reference signal generator circuit.
Figure 3B:
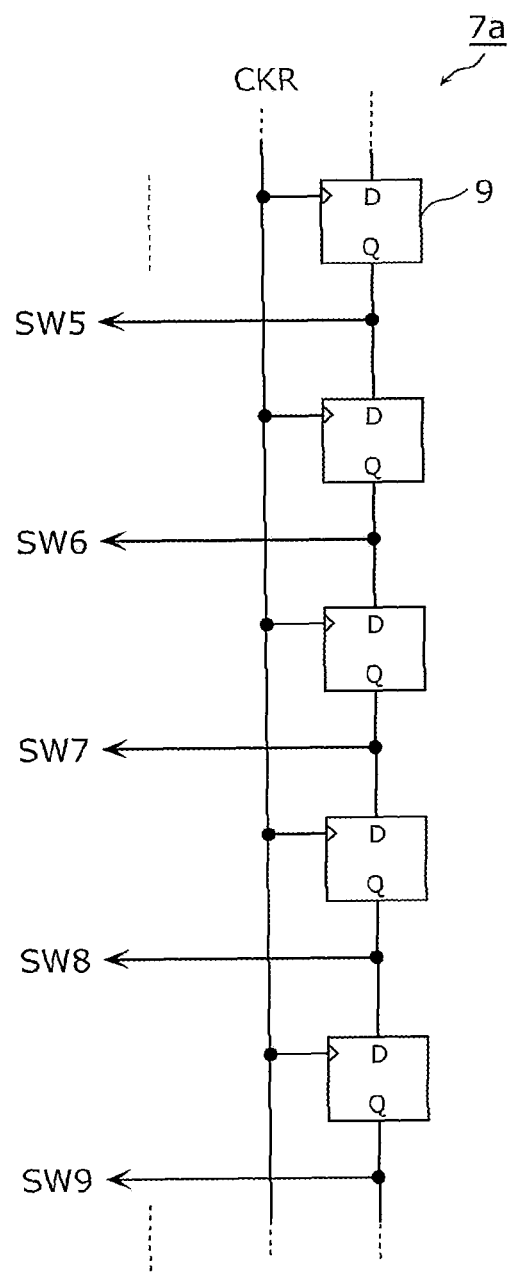
FIG. 3B is a diagram illustrating a configuration of a shift register in the exemplary configuration of the conventional reference signal generator circuit.

FIG. 3A is a diagram of an exemplary configuration of a conventional reference signal generator circuit. FIG. 3B is a diagram illustrating a configuration of a shift register in an exemplary configuration of the conventional reference signal generator circuit. When the reference signal generator circuit is of a ladder resistor type digital-to-analog converter (DAC) as illustrated in FIG. 3A, a ramp signal is normally generated from outputs of flip-flops of the shift register 7a illustrated in FIG. 3B. More specifically, the ramp signal is generated by switching switches for switching at voltage division points in the listed order of SW1, SW2, SW3, ... arranged adjacent to each other in the direction from the VTOP side to the VBTM side.

Figure 4A:
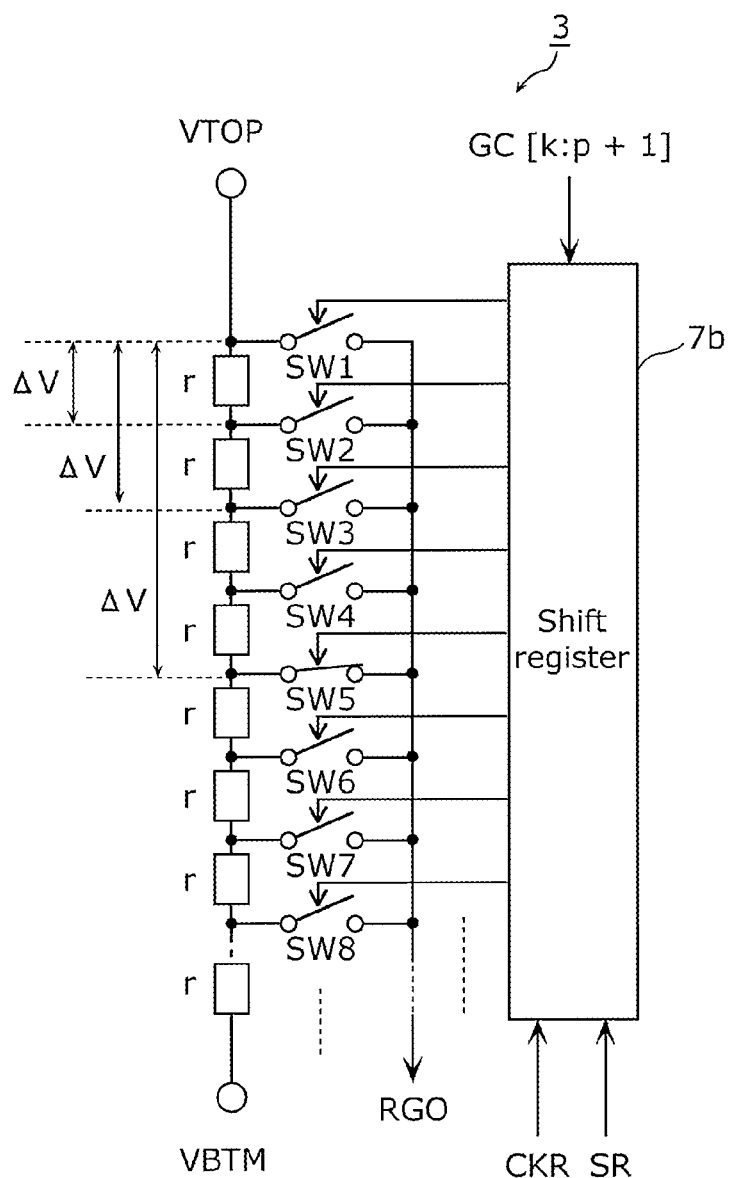
FIG. 4A is a diagram of an exemplary configuration of a reference signal generator circuit according to Embodiment 1.
Figure 4B:
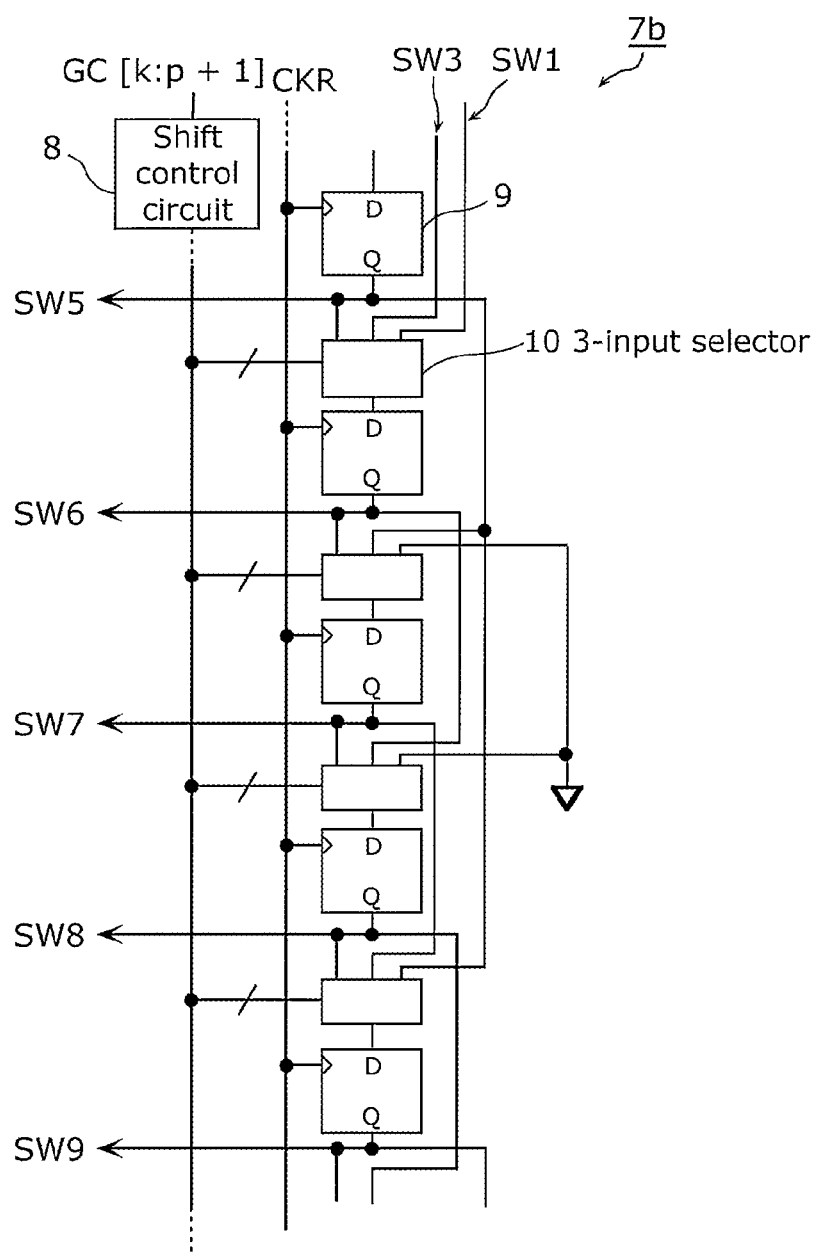
FIG. 4B is a diagram illustrating a configuration of the shift register in the exemplary configuration of the reference signal generator circuit according to Embodiment 1.

FIG. 4A is a diagram of an exemplary configuration of a reference signal generator circuit 3 according to Embodiment 1. FIG. 4B is a diagram illustrating a configuration of a shift register in an exemplary configuration of the reference signal generator circuit 3 according to Embodiment 1. The reference signal generator circuit 3 illustrated in FIG. 4A includes: a ladder resistor string in which a plurality of unit resistors r are connected in series; switches (SW1, SW2, ... ) for selecting voltage division points that are connection points in the ladder resistor string; and a shift register 7b which causes the switches to switch between open and closed states. Here, voltages of the respective voltage division points form a step voltage signal that is variable by an equal amount per unit time. The reference signal generator circuit 3 generates a ramp waveform by outputting the voltages at the respective voltage division points starting with the start voltage VTOP and ending with the end voltage BTM, in synchronization with a ramp driving clock.

The shift register 7b causes the switches to switch between open and closed states continuously starting with the switch SW1 closer to the end (VTOP terminal) of the ladder resistor string in synchronization with the ramp driving clock, so that the voltages at the voltage division points selected by the switches are continuously generated and thereby the ramp waveform is generated. Furthermore, the reference signal generator circuit 3 according to this embodiment has a configuration obtained by adding a shift control circuit 8 as illustrated in the shift register 7b in FIG. 4B to the ramp generator circuit illustrated in FIGS. 3A and 3B, and thereby generates a ramp signal. For example, the shift register 7b has a configuration in which a plurality of flip-flops 9 and a plurality of 3-input selectors 10 are alternately connected to each other in a column. The shift control circuit 8 controls the 3-input selectors according to a value of a higher order bit of a gain control signal so that each of the voltage division points which are for a power-of-2 number of flip-flops positioned serially on a per power-of-2 basis among the plurality of flip-flops 9 is switched in synchronization with the ramp driving clock. It is to be noted that the ramp driving clock is a clock obtained by multiplying the frequency of an input clock by a predetermined power of 2 according to the value of a higher order bit of the gain control signal. In this way, the slopes of the ramp waveforms are varied on a per power-of-2 basis according to the value of the higher order bit of the gain control signal.

More specifically, the slopes of ramp signals are controlled to be doubled, quadrupled, octupled, . . . by skipping power-of-2 ladder resistors corresponding to the switches arranged for every two, four, eight, . . . , according to a set value for the higher order bit of the gain control signal. To double, quadruple, or octuple the slope of a ramp signal for generating a ramp driving clock by multiplying the frequency of an input clock by a predetermined power of 2 corresponds to −6 dB step variable gain switch control.

Accordingly, for example, the reference signal generator circuit 3 having the configuration illustrated in FIGS. 4A and 4B assigns higher order bits for 6 dB step switch control and lower order bits for fine-adjustment switch control ranging from 0 to 6 dB, in the entire gain range without limiting to the negative gain range. In this way, it is possible to assign variable gain switch steps evenly.

[1. 1. 2 Structure of Variable Gain Circuit]

The variable gain circuit 2 sets a start voltage VTOP and an end voltage VBTM of a ramp signal supplied to the reference signal generator circuit 3 according to a gain control signal value. Next, the variable gain circuit 2 exponentially controls the amplitudes (VTOP−VBTM) of ramp signals so that amplitude rates each determined based on the ratio between the slope of a ramp signal in the case where the value of a gain control signal is equal to a preset value of the standard gain and the slope of a ramp signal in the case where the value of a gain control signal is an arbitrarily set value of a gain become linear with respect to the value of the gain control signal. In addition, when the value of the gain control signal indicates a negative gain in response to a standard voltage VIN output from the standard voltage control circuit 1, the variable gain circuit 2 also sets a start voltage VTOP and an end voltage VBTM which define the ramp waveform of each area, so that a period ratio of ramp driving clocks between adjacent areas and the ratio of a ramp signal amplitude at the time of setting the standard gain and the largest ramp signal amplitude in each area become equal to each other.

Figure 5:
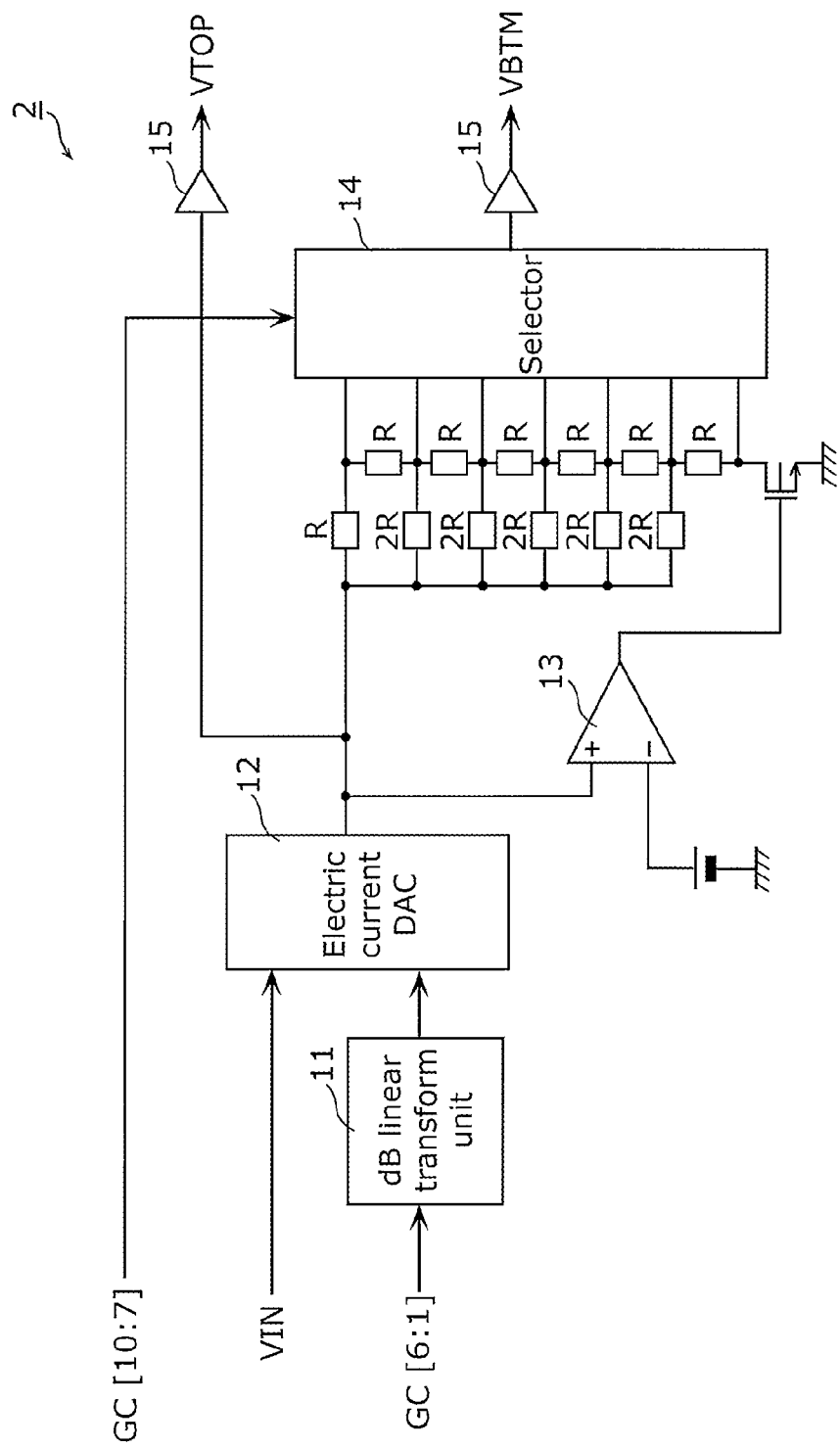
FIG. 5 is a diagram illustrating an exemplary configuration of a variable gain circuit according to Embodiment 1.

FIG. 5 is a diagram illustrating an exemplary configuration of a variable gain circuit according to Embodiment 1. As illustrated in the diagram, a higher-order 4-bit gain setting code GC [10:7] in a gain setting code GC [10:1] is input to the selector 14. Based on this, the selector 14 is subjected to decoding, a voltage division point weighted by a power of 2 of an R2R type resistor circuit is selected, and a voltage of the voltage division point is output as an end voltage VBTM via the buffer 15. In addition, an output node voltage of the current DAC 12 is maintained at a predetermined voltage under feedback control by the amplifier 13, and is output as a start voltage VTOP via the buffer 15.

When higher order bits indicate a code of a negative gain range, the selector 14 fixedly selects, as the end voltage VBTM, the voltage division point that is most distant from the start voltage VTOP. In addition, the selector 14 selects a voltage division point as the end voltage VBTM according to the value of higher order bits in a code range from 0 dB to higher decibels. A selection operation in the code range from 0 dB to the higher decibels corresponds to 6 dB step switch control by higher order bits in a positive gain range.

On the other hand, a lower 6-bit gain setting code GC [6:1] is subjected to logarithmic linear processing by the dB linear transform unit 11, and the resulting code is input to the current DAC 12. A full-scale current of the current DAC 12 is controlled by a standard voltage VIN. With this configuration, the output current from the current DAC 12 is varied in a range from 1 to 2 times of a current associated with a standard voltage VIN with the resolution of the lower order bits. This corresponds to fine-adjustment switch control from 0 to 6 dB described earlier.

With a combination of control for the higher order bits and control for the lower order bits, the variable gain circuit 2 realizes a function for exponentially controlling the amplitudes (differences each between a start voltage VTOP and an end voltage VBTM) of the ramp signals so that the values of gains as a whole have a linear relationship with the values of gain setting codes.

It is to be noted that the difference voltage between the start voltage VTOP and the end voltage VBTM at the time when the gain setting code GC [10:1] indicates that the standard gain is set is adjusted by controlling the standard voltage VIN output from the standard voltage control circuit 1.

[1. 1. 3 Gain Control in Negative Gain Range]

Next, gain control in a negative gain range is described.

The clock control circuit 6, (i) when a value of a gain control signal indicates a negative gain smaller than a standard gain, associates, one to one, fractional-N clocks as input clocks of the reference signal generator circuit with areas, and selectively outputs, as one of the input clocks of the reference signal generator circuit 3, one of the fractional-N clocks which is used in an associated one of the areas to which the gain control signal belongs, the fractional-N clocks including $2^m$ kinds of fractional-N clocks obtained by performing fractional-N frequency division on a frequency of a base clock according to $1/\{2^{\hat{}}(m+1)-n\}$ (an integer satisfying $0 \leq n < 2^{\hat{}}m$) and being associated with the areas in an ascending order of frequencies, the areas being obtained by dividing a code range of $2^{\hat{}}m$ (an integer satisfying $m > 0$) represented by a lower order bit of the gain control signal and being associated with the input clocks in an ascending order of differences from a value of a gain control signal at a time when the standard gain is set. In addition, (ii) when the value of the gain control signal indicates a positive gain larger than or equal to the standard gain, the clock control circuit 6 selectively outputs, as one of the input clocks of the reference signal generator circuit, a lowest-frequency fractional-N clock among the 2^m kinds of fractional-N clocks; a standard voltage control circuit which outputs a standard voltage controlled to have a magnification equal to a period ratio between the one of the input clocks selectively output from the clock control circuit and an input clock of the reference signal generator circuit at the time when the standard gain is set.

In FIG. 2, when a gain control signal value transferred in the form of a digital control signal DIN indicates a negative gain range lower than the standard gain, a gain area identification signal GAS [m:1] indicates, using 2 bits, a signal representing an area to which a gain setting code GC [6:1] belongs, when 64 codes in a code range represented using lower 6 bits of a gain setting code is divided, for example, into 4 areas (when m=2 is satisfied). In other words, as area information representing a variable gain area of 6 dB and lower decibels set by a digital control signal DIN, code information of three area boundary codes among code values from 0 to 63 represented by lower 6 bits of a gain setting code are set by the control circuit 5 in advance. Based on the result of comparison between the gain setting code and each of the area boundary codes, to which one of the areas in the range from 0 to 63 the gain setting code belongs is identified, and identification codes of four areas represented by GAS [2:1]=[0, 0], [0, 1], [1, 0], and [1, 1] are input to the standard voltage control circuit 1 and the clock control circuit 6.

The clock control circuit 6 generates, based on a base clock CLK0, fractional-N clocks of several kinds corresponding in number to the areas, selects a clock of a frequency division ratio corresponding to the value of the gain area identification signal GAS, and outputs the selected clock as a ramp generating clock CKR to the reference signal generator circuit 3. It is to be noted that the frequency ratio between the generated fractional-N clocks needs to be equal to or lower than a frequency ratio corresponding to a gain switch step for the higher order bits of the gain setting code. In other words, when the number of areas is 4, it is necessary to determine such a base clock frequency and a frequency division ratio that make the ratio between the highest frequency and the lowest frequency among the four kinds of fractional-N clocks to be equal to or lower than the double of a frequency switching ratio under higher order bit control.

The four kinds of fractional-N clocks determined according to the above-described rules in this embodiment are fractional-N clocks of ⅛, 1/7, ⅙, and ⅕ with respect to the base clock (¼ equals to the double of ⅛).

At this time, the standard voltage control circuit 1 generates several kinds of standard voltages corresponding in number to the areas, selects a standard voltage corresponding to the value of the gain area identification signal GAS, and outputs the selected standard voltage as a standard voltage VIN of the variable gain circuit 2. The generated standard voltage is associated with the period ratio between fractional-N clocks generated by the clock control circuit 6.

Figure 6:
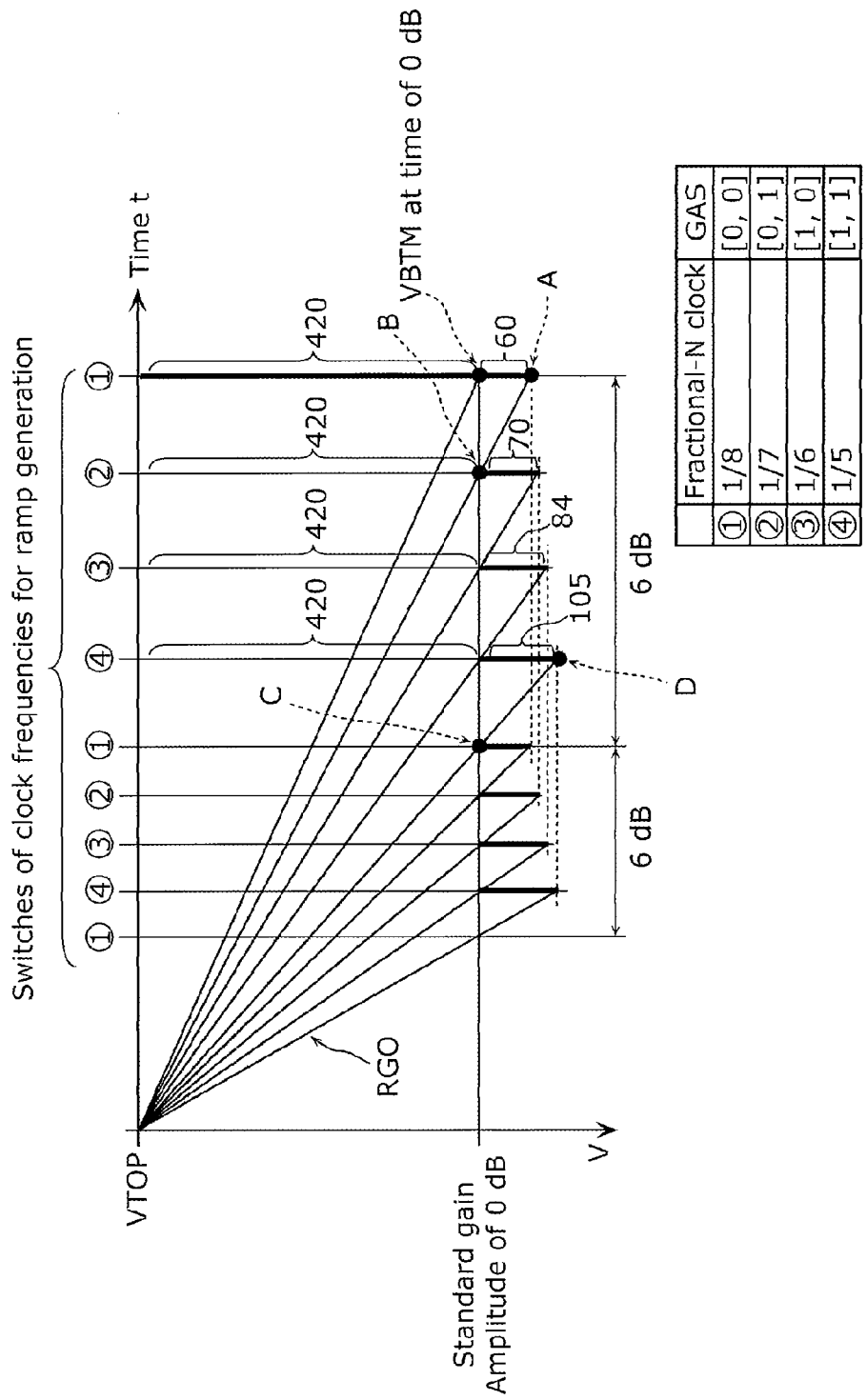
FIG. 6 is a diagram illustrating a gradient of a ramp signal under control of variable gain circuit in a negative gain range.

FIG. 6 is a diagram illustrating the slope of a ramp signal under control of the variable gain circuit in a negative gain range. More specifically, FIG. 6 illustrates relationships between gain area identification signals GAS in the negative gain range, switches of ramp generating clocks CKR, switches of standard voltages VIN, and variable slopes of ramp signals RGO under control by the variable gain circuit 2.

The ramp signal end voltages VBTM transition along bold lines denoted as 60 etc. in FIG. 6 by control using gain setting codes GC, which varies the slopes of the ramp signals RGO. In the positive gain range, the end voltage VBTM takes a value ranging from the start voltage VTOP to the end voltage VBTM at the time of 0 dB, which sets the slopes of the ramp signals RGO. On the other hand, when a gain setting code GC is varied from the point at the time of 0 dB to a first area boundary code at the negative gain side, the end voltage VBTM transitions from the end voltage VBTM at the time of 0 dB to Point A which makes the slope of the ramp signal RGO steeper. The ⅛ clock is selected as the fractional-N clock in the range, and the GAS signal is [0, 0]. The ramp signal amplitude at this time has a relationship of (420+60)/420 times=8/7 with respect to the 0 dB amplitude.

Next, the ⅛ clock is switched to the 1/7 clock and the GAS signal is changed to [0, 1] to transition to Point B. At this time, the amplitude of the ramp signal RGO is switched to ⅞ at the same time. In other words, the standard voltage VIN output from the standard voltage control circuit 1 is changed to a voltage of ⅞ with respect to the voltage at the time when the GAS signal is [0, 0]. In this way, it is possible to perform continuous slope control for the ramp signals RGO.

The end voltage VBTM decreases from Point B until the gain setting code GC reaches a second area boundary code, in the same manner as described above. When the gain setting code GC reaches the second area boundary code, the 1/7 clock is switched to the ⅙ clock, the GAS signal [0, 1] is changed to [1, 0]. At this time, the standard voltage VIN is changed to the voltage of 6/7 with respect to the voltage at the time when the GAS signal is [0, 1].

The sequence of operations is repeated for each of the four areas obtained by dividing the code range represented by the lower order bits of the gain setting code. When the higher order bits of the gain setting code are switched in the same manner, an end voltage VBTM (Point C) at the time of −6 dB is reached. At this time, the standard voltage VIN at Point C, fractional-N clocks, and the values of GAS signals are identical to those at the time of 0 dB. However, as the difference, the ramp generating clock CKR is the one doubled by the clock multiplier circuit of the reference signal generator circuit 3. Accordingly, the ramp signal has the identical amplitude and the doubled slope.

Figure 7:
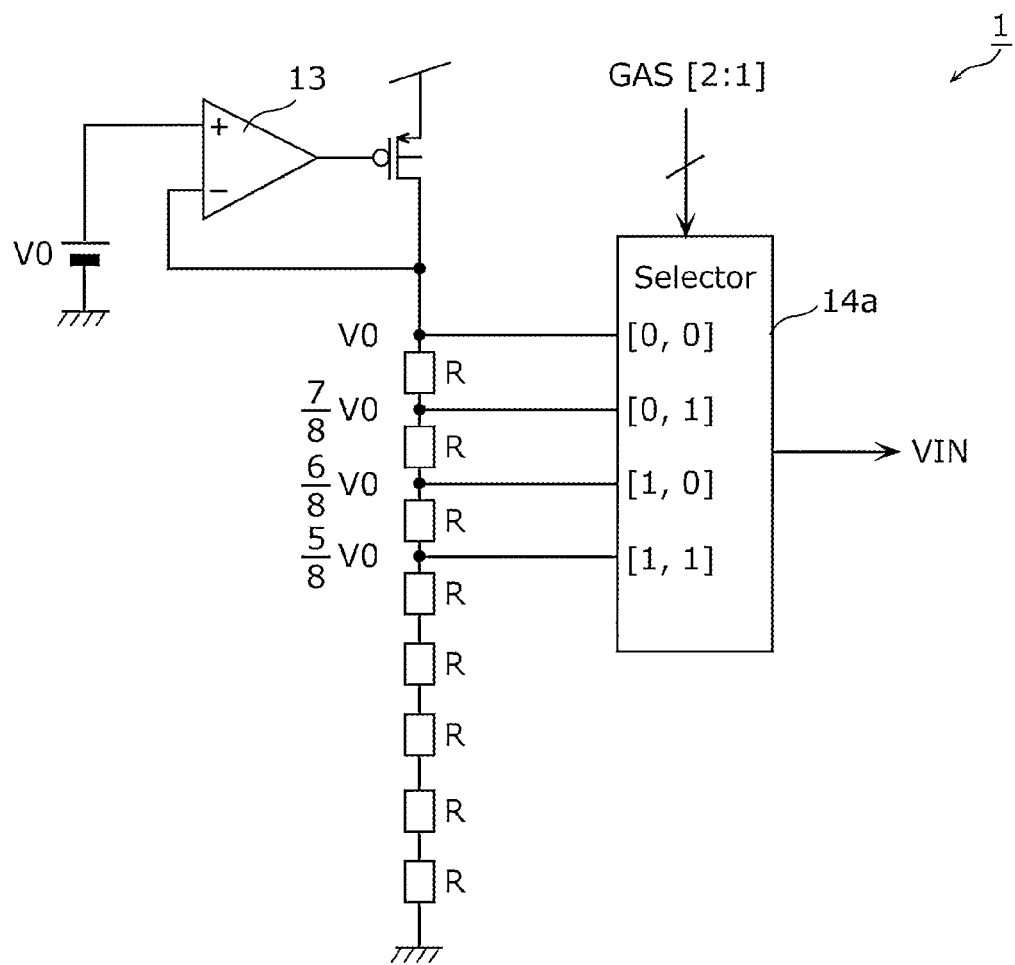
FIG. 7 is a diagram illustrating an exemplary configuration of a standard voltage control circuit according to Embodiment 1.

The above-described control is repeated for each switch (on a per 6 dB basis) of the higher order bits of the gain setting code, and thereby the slopes of the ramp signals are controlled continuously. It is to be noted that the amplitude of the ramp signal becomes the largest amplitude when the gain area identification signal GAS is [1, 1], in other words, the fractional-N clock is the ⅕ clock at Point D, and the amplitude is 5/4 with respect to the amplitude at the time of 0 dB FIG. 7 is a diagram illustrating an exemplary configuration of a standard voltage control circuit according to Embodiment 1. The standard voltage control circuit 1 illustrated in the diagram is configured to be able to output a standard voltage VIN corresponding to gain control in the above-described negative gain range. In other words, one of voltage division points of ⅞, ⅚, and ⅝ is selected for a predetermined voltage V0 from the selector 14a according to the voltage of a gain area identification signal GAS [2:1], and the selected one is output as a standard voltage VIN. In other words, the standard voltage control circuit 1 outputs a standard voltage controlled to have a magnification equal to the period ratio between an input clock of the reference signal generator circuit 3 that is selectively output from the clock control circuit 6 and an input clock of the reference signal generator circuit 3 at the time when the standard gain is set.

It is to be noted that the range of the gain setting codes between boundary areas are automatically determined by a ratio of amplitudes of ramp signals. For example, the range of gain setting codes in the ⅛ clock area (in which a transition is made from the end voltage VBTM at the time of 0 dB to Point A in FIG. 6) is obtained by gain conversion according to 20·LOG (8/7)=1.16 dB where the ratio of the amplitude in the ⅛ clock area is 8/7 with respect to the amplitude of 0 dB.

The range of codes in the area is obtained from the ratio for 6 dB (64 codes) according to {(20·LOG 10 (8/7))/(20·LOG 102)}×64=12.33≈12. It is possible to determine the code range by rounding up or down decimal places within a range in which monotonic continuity in control is maintained.

The range of codes and the code range of each of the other areas can be calculated from the ratio of the amplitude in the area in the same manner.

[1. 1. 4 Variable Characteristics of Ramp Signal Amplitude with Respect to Gain Setting Code]

Next, a description is given of variable characteristics of a ramp signal amplitude that is the difference between a start voltage VTOP and an end voltage VBTM with respect to a gain setting code for a ramp signal output from the ramp generator circuit 27.

Figure 8A:
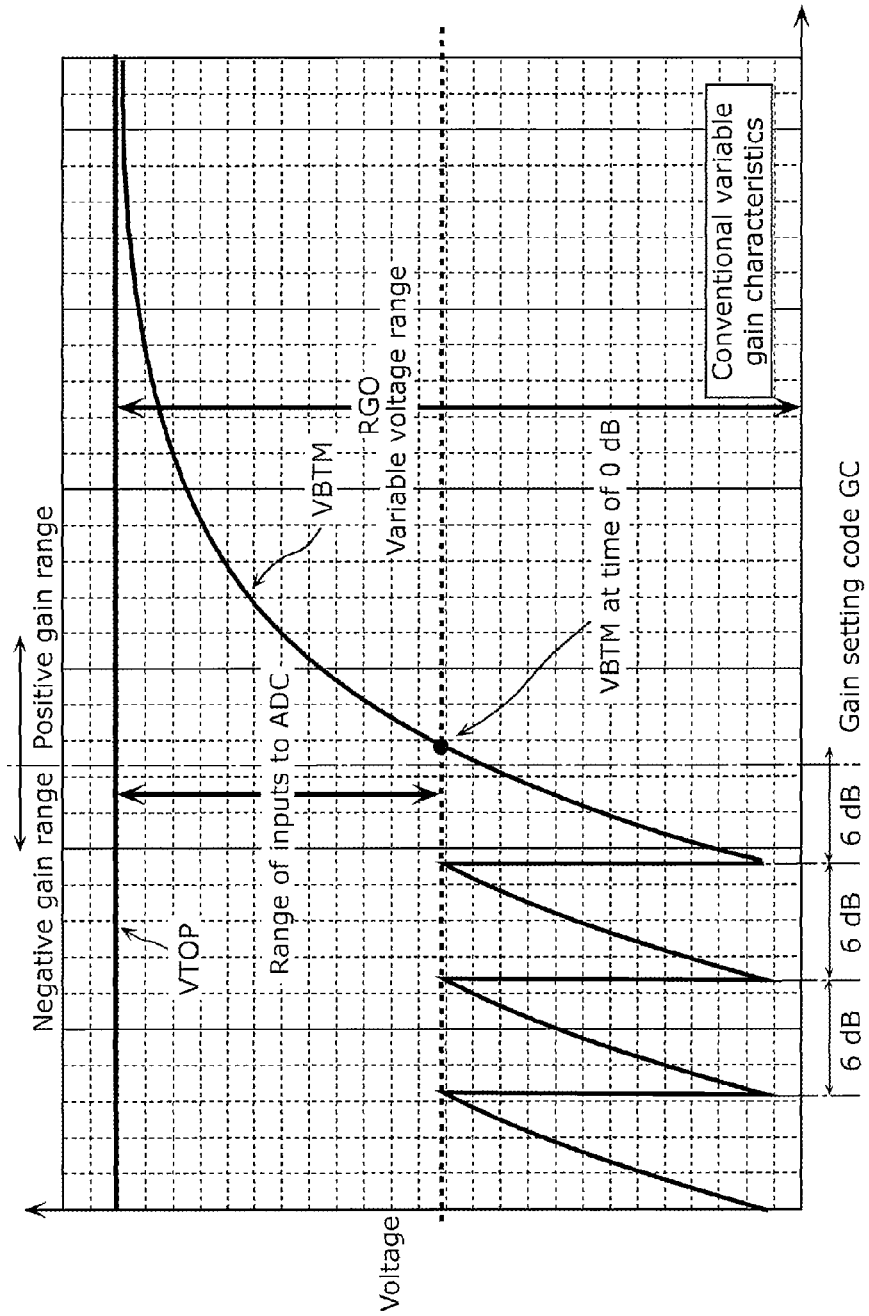
FIG. 8A is a graph illustrating variable gain characteristics in a conventional configuration.

FIG. 8A is a graph illustrating variable gain characteristics in a conventional configuration. In addition, FIG. 8B is a graph illustrating a variable gain characteristic of a ramp generator circuit according to Embodiment 1.

As is known from FIG. 8A, as a variable gain characteristic in a conventional art, the standard amplitude of a ramp signal RGO indicated as the difference between a start voltage VTOP and an end voltage VBTM at the time of 0 dB is ½ of a variable voltage range of the ramp signal RGO. This setting is necessary to ensure the range of a full-scale current in the negative gain range. In this way, an ADC input range available in the entire gain range is reduced to ½ of an operable voltage range.

Figure 8B:
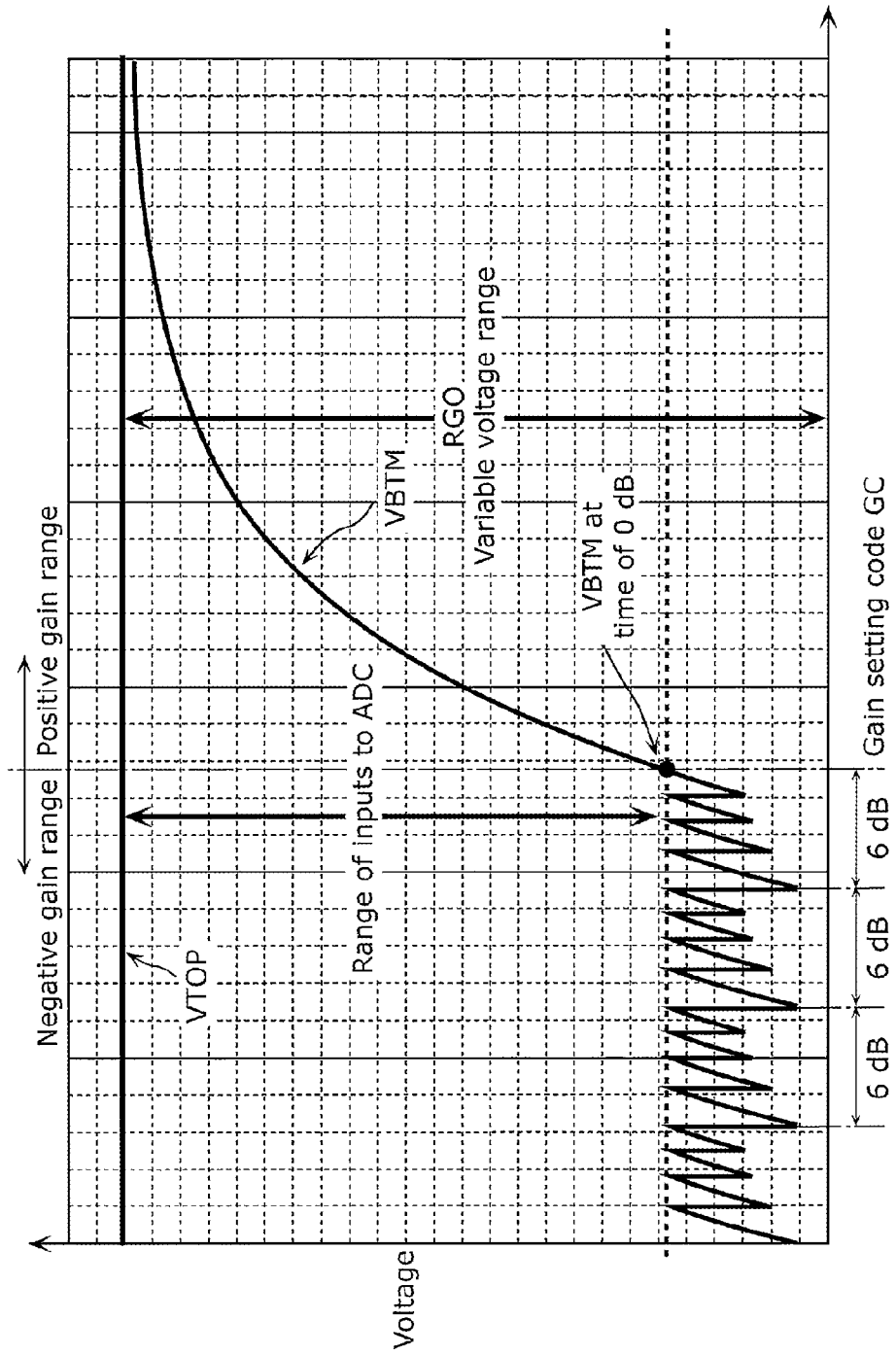
FIG. 8B is a graph illustrating variable gain characteristics of a ramp generator circuit according to Embodiment 1.

On the other hand, in the ramp generator circuit 27 in this embodiment illustrated in FIG. 8B, a standard amplitude of a ramp signal RGO is ⅘ of an operable voltage range. In this way, compared to the conventional configuration, an ADC input range can be widened by 1.6 times. In other words, the amplitude of the ramp signal RGO output from the reference signal generator circuit 3 is increased by 1.6 times with respect to that of the conventional configuration.

[1. 1. 5 Structure of Attenuator]

The attenuator 4 is connected to a subsequent stage of the reference signal generator circuit 3, and in the case where the value of the gain control signal indicates a negative gain, the attenuation ratio is fixed to a predetermined value. In the opposite case where the value of the gain control signal indicates a positive gain, an attenuation ratio is set by variable control so that the amplitude rate of the entire system becomes linear with respect to the value of the gain control signal. Based on the attenuation ratio, the attenuator 4 outputs the attenuated ramp signal by attenuating the ramp waveform generated by the reference signal generator circuit 3. In other words, the attenuator 4 adjusts the amplitude of the ramp signal RGO output from the reference signal generator circuit 3 to a necessary ramp signal amplitude. For example, by reducing the attenuation ratio of the attenuator 4 to ⅝, it is possible to adjust the ramp signal RGO increased by 1.6 times with respect to the above-described conventional configuration to an amplitude substantially equal to the ramp signal in the conventional configuration.

Figure 9:
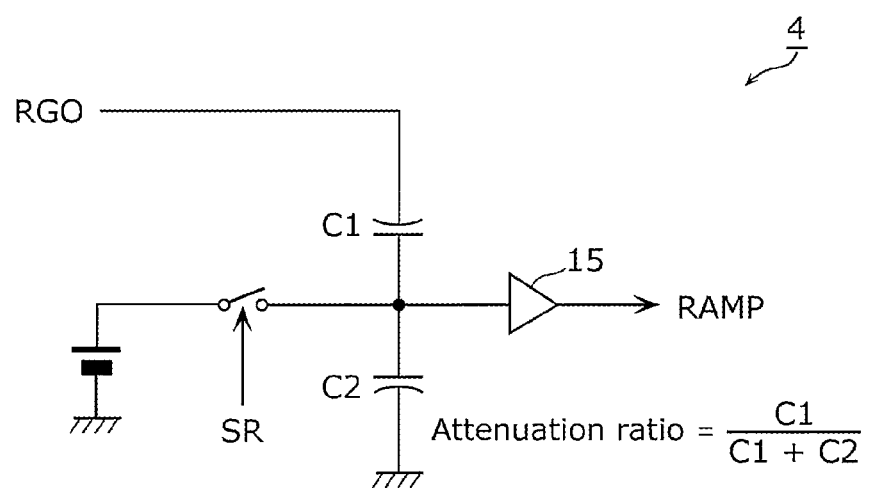
FIG. 9 is a diagram illustrating an exemplary configuration of an attenuator according to Embodiment 1.

FIG. 9 is a diagram illustrating an exemplary configuration of the attenuator according to Embodiment 1. The attenuator 4 illustrated in FIG. 9 includes: a voltage divider circuit in which a capacitor C1 and a capacitor C2 are connected in series; a buffer 15; and an initializer switch for initializing voltages of voltage distribution nodes. An ideal attenuation ratio is obtained according to C1/(C1+C2). However, in reality, the value of a capacitance is determined to be effective ⅝ including parasitic components such as a transistor gate capacitance of the input terminal of the buffer 15. The voltage of each voltage distribution node receives an input of a reset signal SR before the reference signal generator circuit 3 starts a ramp signal, so as to be initialized to a predetermined voltage.

With the configuration, it is possible to set a power supply voltage to be low, and to thereby reduce power to be consumed and random noise that occurs in the ramp signal. In the conventional configuration, for example, when an operable voltage range that can be ensured in the case where a power supply voltage is 3.3 V is 2.5 V, a pixel saturation level at which AD conversion is possible even if an attenuation ratio is 1 time is 1.25 V or below. On the other hand, the ramp generator circuit 27 in this embodiment is capable of ensuring a voltage level substantially equal to the pixel saturation level even if a power supply voltage of 2.8 V and an attenuation ratio of ⅝ are set.

In addition, a variation range of difference voltages each between a start voltage VTOP and an end voltage VBTM is reduced in the negative gain range, which reduces variation in power supply current made by a set gain. This provides an effect of being able to reduce influence to peripheral circuits made by voltage variation through shared impedances of a power supply and grounds.

The ladder resistor type voltage DAC included in the reference signal generator circuit 3 according to this embodiment is configured to receive supply of the end voltage VBTM from the variable gain circuit 2, but it is to be noted that the ladder resistor type voltage DAC may be configured to receive supply of a current at one of the terminals of each ladder resistor as in the configuration in Patent Literature 1. In this case, with the supply of the variable current having control characteristics equivalent to the variable voltage illustrated in FIG. 8B, it is possible to generate an equivalent end voltage VBTM, thereby obtaining the same result.

In addition, a case where the start voltage VTOP has a constant value has been described to explain control characteristics of the variable gain circuit 2 according to this embodiment. However, any configuration that makes, as an equivalent variable characteristic, the difference voltage between a start voltage VTOP and an end voltage VBTM provides the same advantageous effect, and thus is included in the scope of the present disclosure.

As described above, the ramp generator circuit 27 according to this embodiment combines, for each gain control signal, the multiplication for the higher order bits and frequency division switching of the base clock for the lower order bits.

The reference signal generator circuit 3 has a clock multiplication function for multiplying the frequency of an input clock by a power of 2 according to higher order bits of a gain control signal, and thereby changes the time axis of the ramp signal on a per 2 times basis by controlling the least significant bit (LSB) of the gain control signal. In this way, a rough-adjustment variable gain function on a per 6 dB basis in the higher order bit control is realized.

In addition, it is assumed that the clock control circuit 6 generates a plurality of frequency clocks each of which is a fractional-N clock obtained from a harmonic base clock under frequency division ratio control (for making the period of an input clock to be an integer-multiple of the period of the base clock) performed on a per base clock period basis. In this way, the reference clock can be multiplied using a simple circuit configuration for masking a base clock pulse.

In this way, the switch on a per doubled frequency basis by the higher order bits of the gain control signal and the switch in the range up to the doubled frequency by the lower order bits are combined, so that switches can be made in the entire frequency range without increasing the number of kinds of frequencies to be generated by dividing the frequency range.

In addition, since the higher order bits of the gain control signal are used to perform the variable gain function for the rough adjustment on a per 6 dB basis, the lower order bits are necessarily used to perform the variable gain function for the fine adjustment in the range from 0 dB to 6 dB so as to ensure continuity in the variable gain control. In the range from 0 dB to 6 dB, (i) the variable gain circuit 2 that controls the difference voltage between the start voltage VTOP and the end voltage VBTM of the ramp signal and (ii) the clock control circuit 6 are used in combination. In this way, it is possible to provide an advantageous effect of saving the voltage range used only to control the slope of the ramp signal without being used as a voltage range necessary for AD conversion.

The clock control circuit 6 generates several kinds of fractional-N clocks equal in number to the areas in the code range for the lower order bits of the gain control signal, so as to perform control for making the slopes of the adjacent areas of the ramp signal to be continuous to each other. For this purpose, a switch between input clock frequencies is made together with ramp signal amplitude control by the variable gain circuit so that the slopes of the areas of the ramp signal match each other at the boundary points.

In other words, the variable gain circuit 2 includes the function for switching the amplitudes of adjacent ones of the areas of the ramp signal at a ratio equal to the period ratio between two kinds of input clocks of the adjacent ones of the areas at the same time when the input clock frequencies are switched before or after the lower order bit code at a boundary point.

In addition, the attenuator 4 reduces the amplitude of the ramp signal maximized with a restriction of the power supply voltage range to the necessary amplitude, and also exerts the function for reducing noise. In particular, to reduce noticeable noise that occurs at the time when image shooting is performed with a low illuminance, a fixed attenuation ratio is set for a gain range at and below a preset gain including the negative gain range. In contrast, the attenuation ratio is reduced by variable control for the higher gain side above the preset gain (in other words, the area in which the value of a gain control signal is larger than the preset value). The attenuation ratio control is a function for changing a scaling down ratio of the amplitude of the ramp signal, and is substantially equivalent to amplification rate control for a variable gain circuit. For this reason, the attenuation ratio and the amplification rate of the variable gain circuit are controlled so that a total amplification rate obtained by multiplying the amplification rate of the variable gain circuit and the attenuation ratio becomes linear with respect to the value of the gain control signal.

With the control, the solid-state imaging device 21 including the ramp generator circuit 27 according to this embodiment is capable of performing gain control by feedback from the external system according to the amount of light incident onto unit pixels, thereby making it possible to obtain high quality images with reduced random horizontal noise. Furthermore, as a countermeasure against increase in the amplitudes of signals output from pixels of imaging devices having a large pixel size and next-generation organic-film image sensors, it is possible to reduce power supply voltage as required in the conventional configuration, thereby reducing power to be consumed.

Embodiment 2

Figure 10:
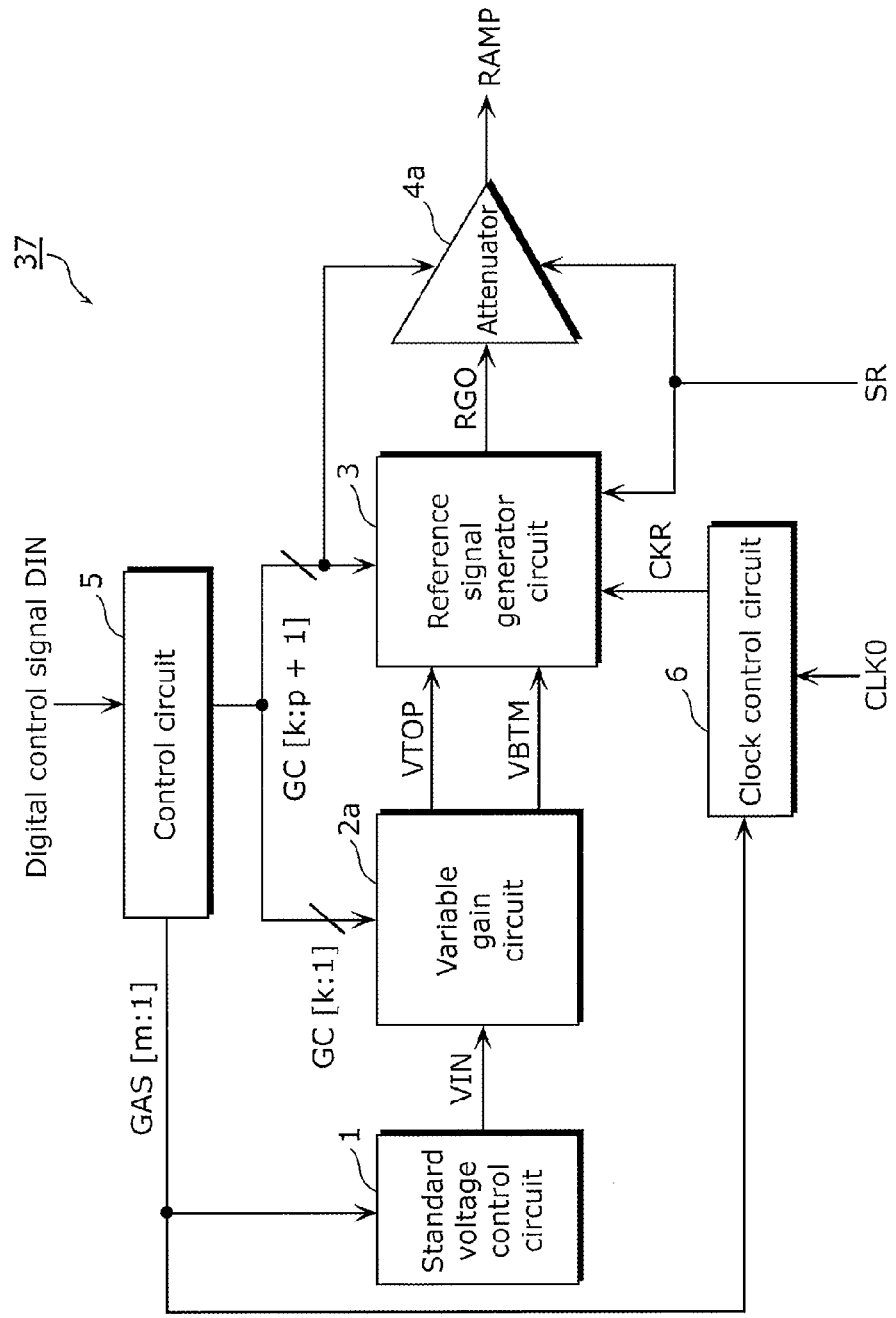
FIG. 10 is an exemplary diagram of a configuration of a ramp generator circuit according to Embodiment 2.

FIG. 10 is an exemplary diagram of a configuration of a ramp generator circuit according to Embodiment 2. The ramp generator circuit 37 illustrated in the diagram includes: a standard voltage control circuit 1 which generates a standard voltage VIN; a variable gain circuit 2a which performs variable control on a start voltage VTOP and an end voltage VBTM of a ramp signal; a reference signal generator circuit 3 which generates the ramp signal; an attenuator 4a which adjusts the amplitude of the ramp signal to an amplitude necessary for AD conversion; a control circuit 5 which generates a control signal for each of blocks in response to a digital control signal DIN; and a clock control circuit 6 which generates a ramp generating clock CKR, based on an external clock CLK0.

The ramp generator circuit 37 according to this embodiment is different from the ramp generator circuit 27 according to Embodiment 1: (i) in that the control circuit 5 inputs higher order bit signal GC [k: p+1] to the attenuator 4a which adjusts the amplitude of the ramp signal to the amplitude necessary for AD conversion; and (ii) in the start voltage VTOP and the end voltage VBTM of the variable gain circuit 2a. In addition, the constituent elements other than the ramp generator circuit 37 in the solid-state imaging device are the same as the constituent elements of the solid-state imaging device 21 according to Embodiment 1. In this embodiment, switches of fractional-N clocks in the negative gain range and operations for switching standard voltages VIN are substantially the same as in Embodiment 1. Thus, the same descriptions are not repeated here, and control in the positive gain range for which different operations are performed is focused on in the descriptions below. In the descriptions below, it is assumed that a gain setting code is a code of 10 bits (k=10, p=6), in other words, that the higher order bits are 4 bits and the lower order bits are 6 bits, as in Embodiment 1.

Figure 11:
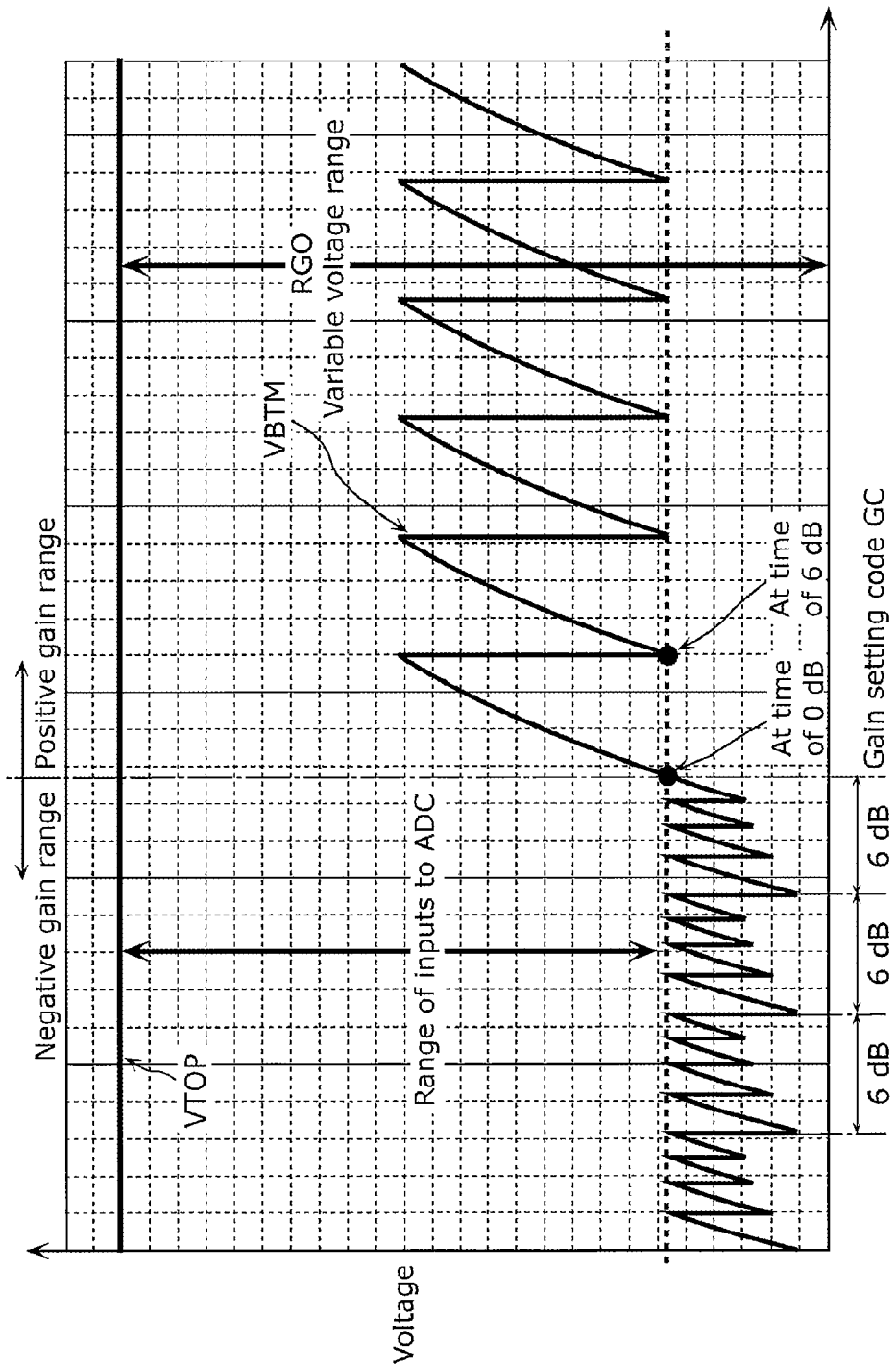
FIG. 11 is a graph illustrating variable gain characteristics of a ramp generator circuit according to Embodiment 2.

FIG. 11 is a graph illustrating variable gain characteristics of a ramp generator circuit 37 according to Embodiment 2. In other words, the variable gain characteristics illustrated in the graph are gain control characteristics of the variable gain circuit 2a. In the diagram, in the range in which gain setting codes GC are below 6 dB, the gain control characteristics are the same as the gain control characteristics of the variable gain circuit 2 according to Embodiment 1 illustrated in FIG. 8A. On the other hand, the range in which gain setting codes GC are of 6 dB or higher, the gain control characteristics of the end voltage VBTM in the range from 0 dB to 6 dB are repeated on a per switch for the higher order bits basis. In this embodiment, in order to obtain the slope of the ramp signal corresponding to the gain setting code GC for the gain control characteristics, the attenuation rate of the attenuator 4a is changed together with the switch for the higher order bits.

Figure 12:
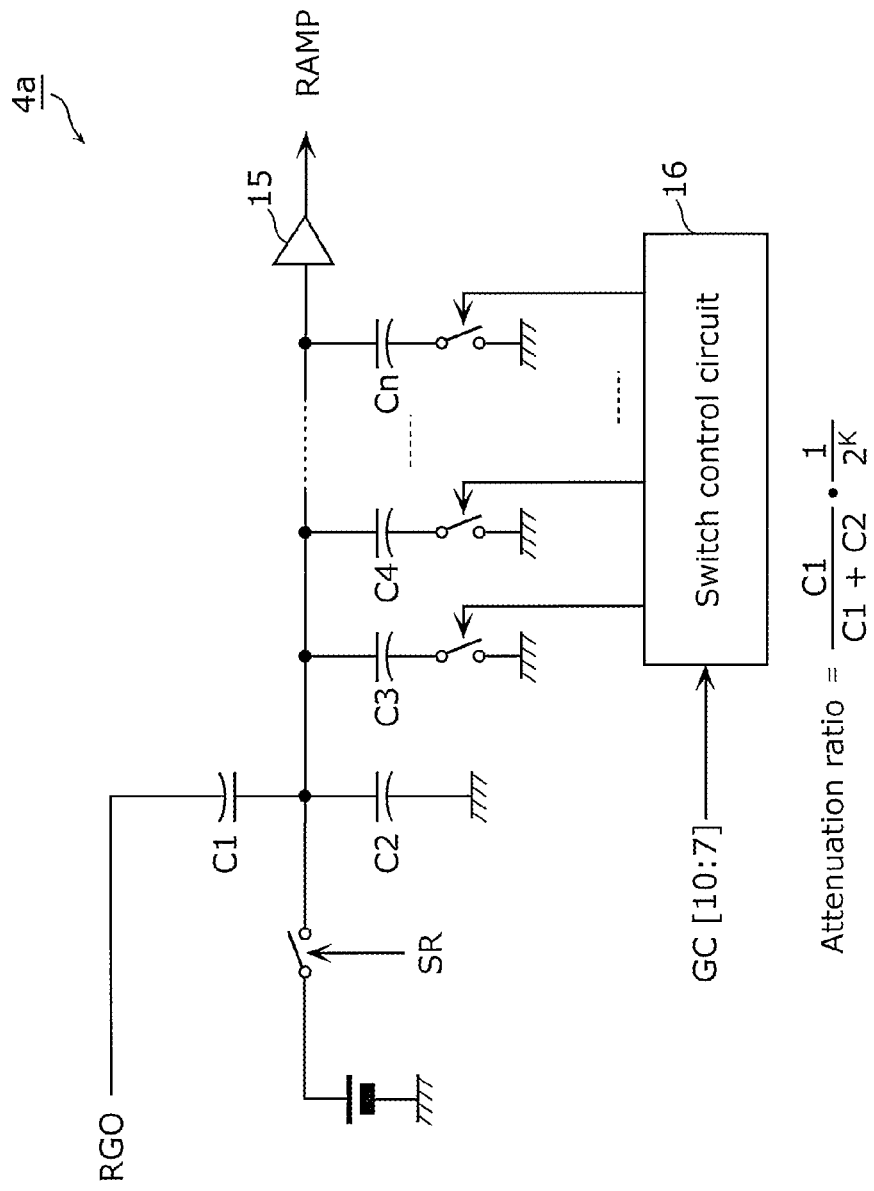
FIG. 12 is a diagram illustrating a first exemplary configuration of an attenuator according to Embodiment 2.

FIG. 12 is a diagram illustrating a first exemplary configuration of the attenuator 4a according to Embodiment 2. As is known from the diagram, the attenuator 4a is different from the attenuator 4 in Embodiment 1 in that switches control connections of capacitors C3 to Cn according to the setting of the higher order bits of a gain setting code GC.

The switch control circuit 16 causes the switches to control the connections of the capacitors C3 to Cn so that attenuation ratios are reduced to ½ on a per 6 dB basis, that is, on a per higher-bit code basis, stating with the higher 4-bit code indicating 0 dB in the gain setting code GC. In other words, the attenuation ratio that is decremented by the higher-bit k code is obtained according to $\{C1/(C1+C2)\} \times 2$-a multiple of k. In other words, when the value of the gain control signal indicates a positive gain, the attenuation ratio is subjected to variable control using a power-of-2 ratio according to the value of the higher order bit of the gain control signal.

When a switching ratio between the attenuation ratios is converted to a variable gain, the switching ratio corresponds to a variable gain on a per 6 dB basis. Thus, in the control within the positive gain range of the variable gain circuit 2a, the attenuator 4a has the gain control function using the higher order bits of the gain setting code, and the variable gain characteristics of the entire system are equivalent to the characteristics (FIG. 8B) in Embodiment 1.

In this way, in addition to the advantageous effect obtainable by Embodiment 1, random noise that occurs in the ramp signal is reduced more significantly as the preset gain becomes higher. Thus, the solid-state imaging device on which the ramp generator circuit 37 is mounted particularly provides an advantageous effect of reducing random horizontal noise in images shot with a low illumination.

As for the variable gain characteristics in FIG. 11, it is to be noted that control on the end voltage VBTM on a per higher-bit code basis within the range in which the gain setting code GC is 6 dB or higher may be repeated arbitrary times. At this time, for example, when the control is repeated once, characteristics within a range of 12 dB or higher after the repeat at the time of 6 dB in the variable gain characteristics become continuous similarly to the variable gain characteristics in FIG. 8B. The attenuation ratio at this time is fixed to C1/(C1+C2)×(½). This relationship can be generalized for a case of an arbitrary number of times of repeat.

Referring to FIG. 12, the respective switches of the attenuator 4a may be MOS transistors. In this case, since sources and drains connected to the capacitors have parasitic capacitances to gates and a substrate, even when the switches turn OFF and one of the ends of a capacitor is cut, the effective value of the capacitor having the cut end does not fall to zero due to a coupling effect of parasitic capacitances. As a result, an error is included in the power-of-2 ratio by the higher order bits of the gain setting code, which disables fine adjustment for the lower order bits and continuity at switch points of the higher order bits in the gain control.

Figure 13:
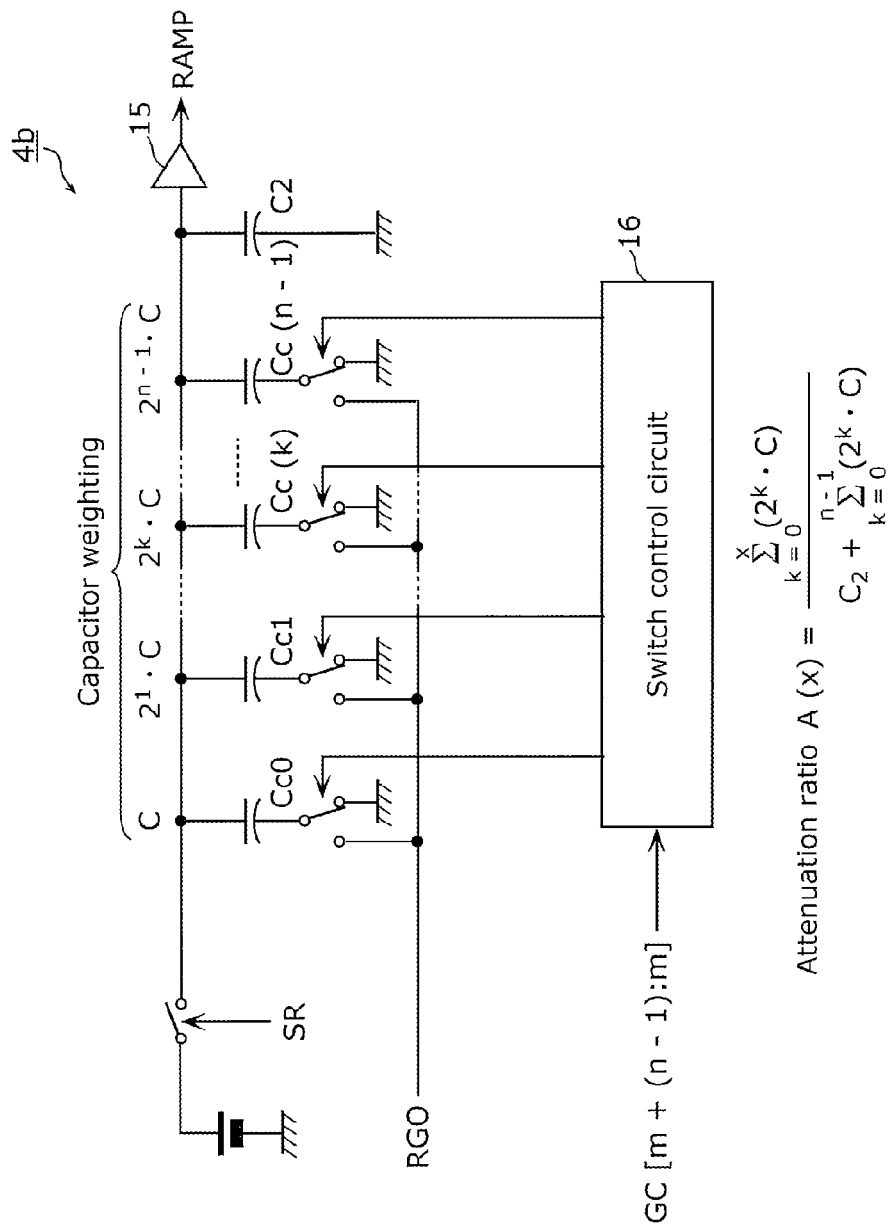
FIG. 13 is a diagram illustrating a second exemplary configuration of an attenuator according to Embodiment 2.

An exemplary configuration for preventing this is illustrated in FIG. 13.

FIG. 13 is a diagram illustrating a second exemplary configuration of the attenuator 4b according to Embodiment 2. In FIG. 13, each of switch capacitors Cc0 to Cc (n−1) has a value weighted by a power of 2, and one of the ends of the capacitor is selectively connected to either a ground or an input terminal RGO by a corresponding one of the switches.

As an example of a control method, a switch control circuit has a function for decoding a switch control signal of each switch into a thermometer code, and connects all of the switch capacitors Cc0 to Cc (n−1) to the input terminal within the range in which the gain setting code indicates a decibel below 6 dB. When the gain setting code indicates a decibel exceeding 6 dB, the switch control circuit causes only the switch capacitor Cc (n−1) having the largest value among the switch capacitors connected to the input terminal to be connected to the ground. This reduces the value of the numerator in the expression for calculating an attenuation ratio to ½. Hereinafter, it is possible to vary the attenuation ratio by the power-of-2 ratio by sequentially switching, on a per gain increase of 6 dB basis, the switch capacitors to the ground in the descending order of values of thermometer codes.

The difference from the configuration in FIG. 12 is that all of the capacitors contribute to operations in all control states. With this configuration, the value of a denominator is always constant including the parasitic capacitance of each switch. Each capacitor connected to the input terminal by switching switches has a value weighted by the power of 2, the value of the numerator is varied by the power of 2. Furthermore, it is possible to realize more accurate control by configuring each switch to have a channel width proportional to the value of the capacitor to which the switch connects, and provides the parasitic capacitor with a weighted value.

Although the ramp generator circuits and the solid-state imaging device have been described above based on Embodiments 1 and 2, ramp generator circuits and a solid-state imaging device according to the present disclosure are not limited to those described in Embodiments 1 and 2. Other embodiments obtainable by combining arbitrary constituent elements in Embodiments 1 and 2 and variations obtainable by adding modifications thereto conceivable by a person skilled in the art without deviating from the scope of the present disclosure, various kinds of devices such as a camera in which the solid-state imaging device disclosed herein is embedded are also included in the present disclosure.

For example, the solid-state imaging device below is also included in the scope of the present disclosure. The solid-state imaging device includes: either the ramp generator circuit 27 according to Embodiment 1 or the ramp generator circuit 37 according to Embodiment 2; a pixel array 22; a vertical scanning circuit 30 which selectively controls each of unit pixels 23 in the pixel array 22 on a per row basis; a comparator 24 which compares an analog signal that is output from each of unit pixels 23 in a row selected by the vertical scanning circuit 30 through a column signal line and a ramp signal that is output from the ramp generator circuit; a counter 25 which counts time from when the comparator 24 starts the comparison to when an output from the comparator 24 is inverted; a digital memory 26 which stores a value counted by the counter 25; a base clock for generating the ramp signal based on a master clock input from an external system and control information; and a timing control unit 31 which generates a timing signal and a gain control signal, wherein the ramp generator circuit generates the ramp signal in response to the base clock and the gain control clock.

INDUSTRIAL APPLICABILITY

The ramp generator circuit according to the present disclosure is capable of reducing voltage required by a power supply, and improving noise characteristics. The ramp generator circuit is applicable to, for example, MOS solid-state imaging devices, organic-film solid-state imaging devices, digital still cameras, movie cameras, mobile phones with a camera, monitoring cameras, medical endoscope cameras, etc.

The invention claimed is:
1. A ramp generator circuit comprising:
a reference signal generator circuit which generates a ramp waveform by outputting a step voltage signal in synchronization with a ramp driving clock having a frequency obtained by multiplying an input clock frequency by a predetermined power of 2 according to a value of a higher order bit of a gain control signal, the step voltage signal having a voltage variable by a fixed amount per unit time ranging from a predetermined start voltage to a predetermined end voltage;
a clock control circuit which:
(i) when a value of a gain control signal indicates a negative gain smaller than a standard gain, associates, one to one, fractional-N clocks as input clocks of the reference signal generator circuit with areas, and selectively outputs, as one of the input clocks of the reference signal generator circuit, one of the fractional-N clocks which is used in an associated one of the areas, the fractional-N clocks comprising $2^m$ kinds of fractional-N clocks obtained by performing fractional-N frequency division on a frequency of a base clock according to $1/\{2^{(m+1)}-n\}$ (an integer satisfying $0 \leq n < 2^m$) and being associated with the areas in an ascending order of frequencies, the areas being obtained by dividing a code range of 2^m (an integer satisfying m>0) represented by a lower order bit of the gain control signal and being associated with the input clocks in an ascending order of differences from a value of a gain control signal at a time when the standard gain is set; and (ii) when the value of the gain control signal indicates a positive gain larger than or equal to the standard gain, selectively outputs, as one of the input clocks of the reference signal generator circuit, a lowest-frequency fractional-N clock among the 2^m kinds of fractional-N clocks;

a standard voltage control circuit which outputs a standard voltage controlled to have a magnification equal to a period ratio between the one of the input clocks selectively output from the clock control circuit and an input clock of the reference signal generator circuit at the time when the standard gain is set;

a variable gain circuit which:

(i) controls amplitudes of ramp signals exponentially so that amplitude rates each defined by a ratio between a slope of a ramp signal in a case where the value of the gain control signal is a preset value of the standard gain and a slope of a ramp signal in a case where the value of the gain control signal is an arbitrarily set value of a gain become linear with respect to the value of the gain control signal; and (ii) sets the predetermined start voltage and the predetermined end voltage which define the ramp waveform which is of each of the areas so that (a) a period ratio between ramp driving clocks for adjacent ones of the areas and (b) a ratio between an amplitude of a ramp signal at the time when the standard gain is set and a largest amplitude of a ramp signal in each of the areas are equal to each other, when the value of the gain control signal indicates the negative gain after receiving the standard voltage output from the standard voltage control circuit; and an attenuator which is connected to a subsequent stage of the reference signal generator circuit, and outputs a ramp signal by attenuating the ramp waveform generated by the reference signal generator circuit.

2. The ramp generator circuit according to claim 1, wherein the attenuator (i) fixedly sets an attenuation ratio to a predetermined value when the value of the gain control signal indicates the negative gain, (ii) sets the attenuation ratio so that an amplification rate of an entire system including the amplification rates becomes linear with respect to the value of the gain control signal by performing variable control on the attenuation ratio when the value of the gain control signal indicates a positive gain larger than or equal to the standard gain, and (iii) outputs the ramp signal by attenuating the ramp waveform generated by the reference signal generator circuit according to the attenuation ratio.

3. The ramp generator circuit according to claim 1, wherein the reference signal generator circuit includes:

a ladder resistor string in which a plurality of unit resistors are connected in series;

switches each of which selects one of voltage division points which are connection points in the ladder resistor string; and a shift register which causes the switches to switch between open and closed states, and the shift register:

(i) sequentially causes, starting with one of the switches which is closest to one of both ends of the ladder resistor string, the switches to switch between open and closed states in synchronization with the ramp driving clock, so that voltages generated sequentially at the voltage division points selected by the switches form a ramp waveform;

(ii) includes a plurality of flip-flops and a plurality of selectors arranged alternately in a column, and controls the selectors according to a value of a higher order bit of the gain control signal so that each of the voltage division points which are for a power-of-2 number of flip-flops positioned serially on a per power-of-2 basis among the plurality of flip-flops is switched in synchronization with the ramp driving clock; and (iii) changes the slope of the ramp waveform on a per power-of-2 basis according to the value of the higher order bit of the gain control signal, by voltages generated by the shift register at the voltage division points for the power-of-2 number of flip-flops.

4. The ramp generator circuit according to claim 2, wherein the attenuation ratio is variably controlled by a power-of-2 ratio according to a value of a higher order bit of the gain control signal, when the value of the gain control signal indicates the positive gain.

5. A solid-state imaging device comprising:

the ramp generator circuit according to claim 1;

a pixel array unit in which unit pixels including photo-electric conversion elements are arranged two-dimensionally in rows and columns and column signal lines are provided for the unit pixels on a per column basis in the rows and columns;

a row scanning unit which selectively controls each of the unit pixels of the pixel array unit on a per row basis;

comparators each of which compares (i) an analog signal output from each of the unit pixels in one of the rows selectively controlled by the row scanning unit via a corresponding one of the column signal lines with (ii) the ramp signal that is a reference signal;

counters which count time from a start time of comparison by the comparators to a time at which outputs from the comparators are inverted;

digital memories which are arranged on a per column basis and store values counted by the counters; and a timing control unit which generates a base clock for generating the ramp signal, a timing signal, and the gain control signal, based on a master clock and control information input from an external system, wherein the ramp generator circuit generates the ramp signal in response to the base clock and the gain control signal.

* * * * *